(12) United States Patent
Ohta

(10) Patent No.: US 9,112,183 B2
(45) Date of Patent: Aug. 18, 2015

(54) DISPLAY PANEL APPARATUS AND MANUFACTURING METHOD OF DISPLAY PANEL APPARATUS

(75) Inventor: Takashi Ohta, Kyoto (JP)

(73) Assignee: JOLED INC., Tokyo (JP)

( * ) Notice: Subject to any disclaimer, the term of this patent is extended or adjusted under 35 U.S.C. 154(b) by 234 days.

(21) Appl. No.: 13/466,470

(22) Filed: May 8, 2012

(65) Prior Publication Data

US 2012/0217521 A1    Aug. 30, 2012

Related U.S. Application Data

(63) Continuation of application No. PCT/JP2010/002387, filed on Mar. 31, 2010.

(51) Int. Cl.
*H01L 29/49* (2006.01)
*H01L 51/52* (2006.01)

(52) U.S. Cl.
CPC ........ *H01L 51/5281* (2013.01); *H01L 51/5275* (2013.01)

(58) Field of Classification Search
USPC .......................................................... 257/79
See application file for complete search history.

(56) References Cited

U.S. PATENT DOCUMENTS

| 7,081,912 | B2 | 7/2006 | Seki et al. |
| 2004/0021762 | A1 | 2/2004 | Seki et al. |

FOREIGN PATENT DOCUMENTS

| JP | 05-094879 | 4/1993 |
| JP | 11-074072 | 3/1999 |
| JP | 2003-282255 | 10/2003 |
| JP | 2003-291404 | 10/2003 |
| JP | 2004-127662 | 4/2004 |
| JP | 2006-196197 | 7/2006 |
| JP | 2006-252988 | 9/2006 |
| JP | 2007-230075 | 9/2007 |
| JP | 2010-040427 | 2/2010 |

OTHER PUBLICATIONS

International Search Report in PCT/JP2010/002387, dated Jun. 22, 2010.
U.S. Appl. No. 13/466,408 to Takashi Ohta, which was filed on May 8, 2012.
International Search Report in PCT/JP2010/002387, dated Jun. 22, 2012.

*Primary Examiner* — Michael Shingleton
(74) *Attorney, Agent, or Firm* — Greenblum & Bernstein, P.L.C.

(57) ABSTRACT

A display panel apparatus includes pixels, each including an organic luminescent layer between first and second electrodes. A glass substrate is above the second electrode. A lens sheet is between the pixels and the glass substrate and includes a lens corresponding to each of the pixels and a base from which the lens protrudes. A first partition is between the glass substrate and the lens sheet on a first side of the base from which the lens protrudes for partitioning, between the glass substrate and the lens sheet, a gap between the lens of each of the pixels. A second partition is between the organic electro-luminescence unit and the lens sheet on a second side of the base opposite the first side from which the lens protrudes for partitioning, between the organic electro-luminescence unit and the lens sheet, the gap between the lens of each of the pixels.

22 Claims, 26 Drawing Sheets

DISPLAY PANEL APPARATUS AND MANUFACTURING METHOD OF DISPLAY PANEL APPARATUS

CROSS REFERENCE TO RELATED APPLICATION

This is a continuation application of PCT Application No. PCT/JP2010/002387 filed on Mar. 31, 2010, designating the United States of America, the disclosure of which, including the specification, drawings and claims, is incorporated herein by reference in its entirety.

BACKGROUND OF THE INVENTION

1. Field of the Invention

The present invention relates to a display panel device and a manufacturing method for the display panel device, and particularly relates to a display panel apparatus with an organic luminescent layer and a manufacturing method thereof.

2. Description of the Related Art

In recent years, self-luminous display panel apparatus such as display panel apparatus having organic Electro Luminescence (EL) device has been attracting attention. It is important for the display panel apparatus having the organic EL element to increase extraction efficiency of light emitted from the organic luminescent layer. A display panel apparatus having pixels each provided with a microlens for increasing the efficiency for extracting light emitted from the organic luminescent layer has been proposed (for example, see Patent Literature 1: Japanese Unexamined Patent Application Publication 11-74072).

FIG. 18 is a cross-section of the conventional display panel apparatus disclosed in Patent Literature 1.

As illustrated in FIG. 18, the conventional display panel apparatus 1000 includes a glass substrate 1006 (the glass substrate at the bottom) on which a first electrode layer 1001, a first insulating layer 1002, an organic luminescent layer 1003, a second insulating layer 1004 and a second electrode layer 1005 are sequentially formed, and a sealing glass 1009 (the glass substrate at the top) where the color filter 1007 and the microlens 1008 are formed. The sealing glass 1009 and the glass substrate 1006 are sealed by sealing resin 1011 at a predetermined interval using the spacer 1010. The gap between the sealing glass 1009 and the glass substrate 1006 is filled with insulating liquid 1012.

The display panel apparatus 1000 increases the extraction efficiency of light emitted from the organic luminescent layer 1003 by setting the photorefractive index n1 of the microlens 1008 and the photorefractive index n2 of the insulating liquid 1012 to satisfy n1>n2.

SUMMARY OF THE INVENTION

However, the conventional display panel apparatus has a problem that the light emits from the organic luminescent layer of a luminescent region completely reflects on the sealing glass and enters adjacent luminescent regions. In this case, if the organic luminescent layers of adjacent luminescent regions emit light in different colors, the total reflection causes color mixture. This causes a problem of lowered contrast in image.

The present invention has been conceived in order to solve the abovementioned problem, and it is an object of the present invention to provide a display panel apparatus which prevents the light completely reflected on a top glass substrate from entering the adjacent luminescent and manufacturing method thereof.

In order to solve the problem described above, an aspect of the display panel apparatus according to the present invention is a display panel apparatus including: an organic electroluminescence (EL) unit which includes an array of pixel units having a first electrode, a second electrode, and an organic luminescent layer which is interposed between the first electrode and the second electrode and emits red, green or blue light; a glass substrate provided above the organic EL unit; a lens sheet interposed between the organic EL unit and the glass substrate and having (i) a lens provided corresponding to each of the pixel units and (ii) a base on which the lens protruding from the base is formed; a first partition provided on a side of the base on which the lens is provided, for partitioning, intermediate between the glass substrate and the lens sheet, a gap between lenses corresponding to, among the pixel units, pixel units which emit light in different colors, and the first partition being at least higher than a height of the lens; and a second partition provided (i) on a side of the base opposite to the side on which the lens is provided and (ii) corresponding to the first partition, for partitioning, intermediate between the organic EL unit and the lens sheet, the gap between the lenses corresponding to the pixel units which emit light in different colors.

As described above, according to the display panel apparatus according to the present invention, the first partition and the second partition prevent the light reflected on the glass substrate from entering the adjacent luminescent region. Therefore, the contrast of the image can be improved.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Figure 1:
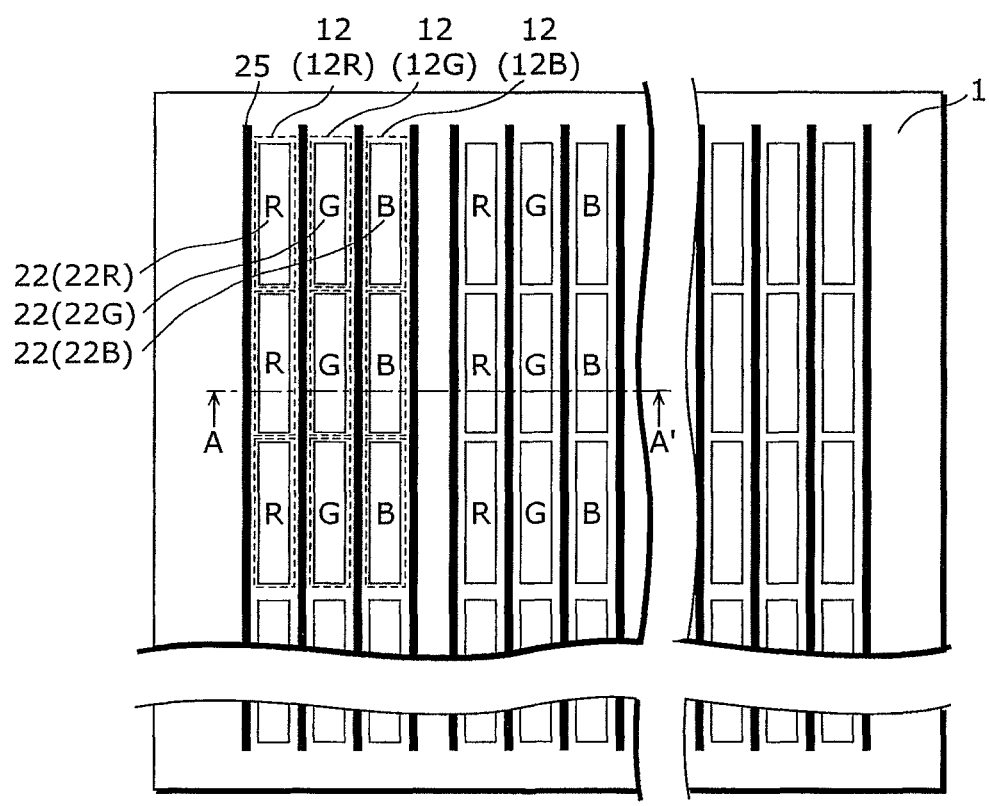
FIG. 1 is a planar view of a display panel apparatus according to the first embodiment of the present invention.

An aspect of a display panel apparatus according to the present invention includes an organic electro-luminescence (EL) unit which includes an array of pixel units having a first electrode, a second electrode, and an organic luminescent layer which is interposed between the first electrode and the second electrode and emits red, green or blue light; a glass substrate provided above the organic EL unit; a lens sheet interposed between the organic EL unit and the glass substrate and having (i) a lens provided corresponding to each of the pixel units and (ii) a base on which the lens protruding from the base is formed; a first partition provided on a side of the base on which the lens is provided, for partitioning, intermediate between the glass substrate and the lens sheet, a gap between lenses corresponding to, among the pixel units, pixel units which emit light in different colors, and the first partition being at least higher than a height of the lens; and a second partition provided (i) on a side of the base opposite to the side on which the lens is provided and (ii) corresponding to the first partition, for partitioning, intermediate between the organic EL unit and the lens sheet, the gap between the lenses corresponding to the pixel units which emit light in different colors.

According to this aspect, the first partition is provided for partitioning a gap between lenses corresponding to pixel units which emit light in different colors, and the first partition is at least higher than a height of the lens. In addition, the second partition is provided (i) on a side of the base opposite to the side on which the lens is provided and (ii) corresponding to the first partition, intermediate between the pixel unit and the lens sheet.

As such, providing the second partition corresponding to the first partition prevents the light reflected on the glass substrate among the light emitted from the organic luminescent layer included in the pixel unit corresponding to one color (the first pixel unit) from traveling from a luminescent region corresponding to the first pixel unit (hereafter referred to as "first luminescent region") to an adjacent luminescent region corresponding to another color (hereafter referred to as "second luminescent region"). To put it differently, the first partition and the second partition can block the light traveling from the first luminescent region to the second luminescent region. This prevents the light emitted from the organic luminescent layer in the first pixel unit in the first luminescent region from entering the second luminescent region which is adjacent to the first luminescent region. Thus, it is possible to prevent the colors of the emitted light to be mixed in a different luminescent region, improving the contrast in image.

Furthermore, in another aspect of the display panel apparatus according to the present invention, it is preferable that the pixel units include: a first pixel unit corresponding to one color; and a second pixel unit adjacent to the first pixel unit and corresponding to another color, and the first partition and the second partition block light traveling to the second pixel unit due to reflection on the glass substrate, the light being emitted from the organic luminescent layer included in the first pixel unit partitioned by first partitions and second partitions.

This structure can block the light among the light emitted from the organic luminescent layer included in the first pixel unit reflected on the glass substrate from traveling to the second pixel unit adjacent to the first pixel unit. This significantly suppresses the reflected light from the glass substrate entering another luminescent region. Consequently, when the organic luminescent layer included in the first pixel unit and the organic luminescent layer included in the second pixel unit are organic luminescent layers which emit light in different colors, it is possible to prevent the color mixture in the adjacent luminescent regions. Therefore, the contrast of the image can be improved.

Furthermore, in an aspect of the display panel apparatus according to the present invention, it is preferable that the lens sheet has a trench (i) formed along a perimeter of a region in the base, in which the lens is formed, and (ii) recessed from a surface of the base in a direction opposite to a protruding direction of the lens, the first partition and the second partition are formed interposing the base, the first partition is inserted into the trench on the lens sheet, the second partition is arranged, on a side opposite to the side on which the lens is provided, to correspond to the first partition inserted into the trench on the lens sheet, and the trench on the lens sheet is used for aligning the first partition and the second partition.

This structure allows the trench of the lens sheet to be used for aligning the second partition with the first partition, when the second partition corresponding to the first partition inserted into the trench of the lens sheet on a side of the base opposite to the side on which the lens is provided. With this, after the first partition is provided on the upper surface of the base between the lenses, the first partition inserted into the trench is projected on the bottom surface (the surface on which the lens is not provided), thereby allowing the position of the first partitions to be recognized. This facilitates positioning of the second partition corresponding to the position of the first partitions, thereby allowing highly precise alignment of the second partition with the first partition.

In addition, in an aspect of the display panel apparatus according to the present invention, it is preferable that a tip of the first partition inserted into the trench on the lens sheet blocks light traveling to the second pixel unit due to reflection on the glass substrate, the light being emitted from the organic luminescent layer included in the first pixel unit.

With this structure, the tip of the first partition inserted into the trench of the lens sheet blocks the light in the first luminescent region and entering the second luminescent region adjacent to the first luminescent region such as the light reflected on the glass substrate passing through the base. As such, the trench provided on the lens sheet can be used for aligning the second partition and the first partition. In addition, the insertion of the first partition prevents the light from the first luminescent region from traveling to the second luminescent region.

Furthermore, in an aspect of the display panel apparatus according to the present invention, it is preferable that, when t denotes a thickness of the base, w1 denotes a width of a bottom surface of the first partition, and w2 denotes a width of a bottom surface of the second partition, w1/t and w2/t are between 3 and 50 inclusive.

This structure suppresses the light in the first luminescent region such as the reflected light reflected on the glass substrate passes through the base and leaks in the second luminescent region adjacent to the first luminescent region as much as possible. Note that, it is difficult to maintain the strength of the lens sheet when $w_1/t$ and $w_2/t$ exceeds 50. Accordingly, it is preferable that $w_1/t$ and $w_2/t$ are 50 or less.

In addition, in an aspect of the display panel apparatus according to the present invention, it is preferable that, when t denotes a thickness of the base and b denotes a distance from an end of a tip of the first partition inserted into the trench on the lens sheet to a top surface of the base, b/t is between 0 and ⅔ inclusive.

This structure allows the lens sheet to maintain its shape even if the lens sheet has the trench which lowers the strength of the lens sheet. This structure also suppresses the light in the first luminescent region such as the reflected light reflected on the glass substrate passing through the base and leaks in the second luminescent region adjacent to the first luminescent region as much as possible, particularly by the portion of the first partition inserted into the trench.

In addition, in an aspect of the display panel apparatus according to the present invention, it is preferable that the first partition penetrates the lens sheet and is connected to the second partition.

This structure eliminates the gap between the first partition and the second partition. Thus, it is possible to prevent the light in the first luminescent region such as the reflected light reflected on the glass substrate from passing through the base and leaking in the second luminescent region adjacent to the first luminescent region.

In addition, in an aspect of the display panel apparatus according to the present invention, it is preferable that the organic EL unit includes at least a pixel unit including an organic luminescent layer which emits blue light, and a gap between second partitions corresponding to the pixel unit including the organic luminescent layer which emits blue light is filled with a resin which selectively transmits blue light.

With this structure, the resin which selectively transmits blue light is filled with the gap between the second partitions extending to the pixel units, thereby preventing the light in the blue luminescent region from entering the luminescent region adjacent to the blue luminescent region. Meanwhile, it is also possible to prevent the light from the luminescent region adjacent to the blue luminescent region from entering the blue luminescent region. More specifically, the second partitions interposing the resin which selectively transmits blue light serves as the black matrix.

In addition, in an aspect of the display panel apparatus according to the present invention, it is preferable that the organic EL unit further includes a pixel unit including an organic luminescent layer which emits red light and a pixel unit including an organic luminescent layer which emits green light; and gaps between the second partitions are filled with a resin with 95% or more and less than 100% of transmission factor of light, the gaps corresponding to the pixel unit including the organic luminescent layer which emits red light and the pixel unit including the organic luminescent layer which emits green light.

As such, filling the transparent resin between the second partitions corresponding to the pixel units including the organic luminescent layers which emit red or green light suppresses the decrease in the amount of light exits above the lens. Furthermore, filling the transparent resin between the second partitions prevents a distortion of the lens sheet, achieving stable light-extraction efficiency.

In addition, in an aspect of the display panel apparatus according to the present invention, the organic EL unit may further include a pixel unit including an organic luminescent layer which emits green light, and a gap between the second partitions corresponding to the pixel unit including the organic luminescent layer which emits green light is filled with a resin which selectively transmits green light. Furthermore, in an aspect of the display panel apparatus according to the present invention, the organic EL unit may further include a pixel unit which includes an organic luminescent layer which emits red light, and a gap between the second partitions corresponding to the pixel unit including the organic luminescent layer which emits red light is filled with a resin which selectively transmits red light.

These structures allows the display panel apparatus that does not use the transparent resin for the gap between the second partitions corresponding to the pixel unit including the organic luminescent layer which emits green light or the gap between the second partitions corresponding to the pixel unit including the organic luminescent layer which emits red light.

In addition, in an aspect of the display panel apparatus according to the present invention, it is preferable that the first partition extends to proximity of the glass substrate.

This structure allows the height of the first partition to be a height sufficient for blocking the reflected light reflected on the glass substrate traveling from the first luminescent region to the second luminescent region. With this, it is possible to prevent the reflected light from the first luminescent region from entering the second luminescent region. Accordingly, it is possible to prevent the color mixture in the adjacent luminescent region, improving the contrast of the image.

In addition, in an aspect of the display panel apparatus according to the present invention, it is preferable that the first partition contacts the glass substrate.

As such, the first partition contacts the glass substrate. Thus, the gap between the glass substrate and the base is closed, completely blocking the gap between the adjacent luminescent regions in the horizontal direction. Therefore, it is possible to securely prevent the light in the first luminescent region such as the light reflected on the glass substrate from entering the second region through the gap between the glass substrate and the base. Furthermore, the first partition contacts the glass substrate, allowing the lens sheet to be fixed with the glass substrate. This prevents the distortion of the lens sheet, achieving the stable light-extraction efficiency.

In addition, in an aspect of the display panel apparatus according to the present invention, it is preferable that sides of the first partition and the second partition are black, and the first partition and the second partition block light traveling from the first pixel unit to the second pixel unit by absorbing the light emitted from the organic luminescent layer included in the first pixel unit and reflected on the glass substrate.

This structure eliminates the light reflected on the first partition and the second partition, further suppressing the light traveling to the different luminescent region. With this, it is possible to prevent the color mixture, improving the contrast of the image.

In addition, in an aspect of the display panel apparatus according to the present invention, it is preferable that the first partition and the second partition block light traveling directly from the first pixel unit to the second pixel unit by absorbing the light emitted from the organic luminescent layer included in the first pixel unit.

This structure blocks the light directly traveling to the second pixel unit from the first pixel unit.

In addition, in an aspect of the display panel apparatus according to the present invention, it is preferable that the first partition and the second partition absorb light entering the first pixel unit from outside of the display panel apparatus via the glass substrate.

This structure allows the first partition and the second partition to function as the black matrix, preventing the external light that entered from outside from entering the pixel unit. Therefore, it is possible to suppress the external light reflecting on the second substrate and re-exiting to outside through the adjacent luminescent region, thereby improving the contrast of the image.

In addition, in an aspect of the display panel apparatus according to the present invention, it is preferable that the pixel units include the organic luminescent layer which is formed along a predetermined direction and emits light in a same color, and the first partition partitions the gap between the lenses corresponding to the pixel units which are formed along the predetermined direction and emit light in different colors.

This structure allows the first partitions to be formed in stripe. The first partitions formed in stripe can partition the gap between the lenses corresponding to the pixel units which emit light in different colors.

In addition, in an aspect of the display panel apparatus according to the present invention, it is preferable that the lens is elongated in top view and has an elliptic arc shape with a predetermined curvature factor in cross-section orthogonal to a longitudinal direction of the lens.

This structure allows one lens to be formed as a semi-cylinder shaped lens.

In addition, in an aspect of the display panel apparatus according to the present invention preferably includes a sealing layer for sealing the pixel units above the second electrode.

With this structure, the pixel unit is sealed by the sealing layer in the manufacturing process of the display panel apparatus, and thus it is possible to prevent moisture and outgases such as oxygen from entering the pixel units.

In addition, in an aspect of the display panel apparatus according to the present invention preferably includes a bonding layer which planarizes irregularity formed over the lens and bonds the lens sheet and the glass substrate.

With this, the lens sheet and the glass substrate can be bonded.

In addition, in an aspect of the display panel apparatus according to the present invention, it is preferable that the glass substrate composes an outer surface of the display panel apparatus.

This structure allows the glass substrate to compose the outer surface of the display panel apparatus.

In addition, in an aspect of the display panel apparatus according to the present invention, it is preferable to include a hole injection layer which injects holes into the organic luminescent layer is included between the organic luminescent layer and the first electrode.

As such, forming, between the organic luminescent layer and the first electrodes, the hole injection layer for injecting the holes into the organic luminescent layer improves the luminescent efficiency of the organic luminescent layer.

In addition, an aspect of the display apparatus according to the present invention includes any one aspect of the display panel apparatus.

This structure allows implementation of various display apparatuses such as television apparatuses.

Furthermore, an aspect of the manufacturing method of the display panel apparatus according to the present invention includes a first process of forming pixel units having a first electrode, a second electrode, and an organic luminescent layer which is interposed between the first electrode and the second electrode and emits red, green or blue light; a second process of forming, above the second electrode, a sealing layer for sealing the pixel units; a third process of preparing a lens sheet having a lens provided corresponding to each of the pixel units, a base on which the lens protruding from the base is formed, and a base material for reinforcing the base on a side of the base opposite to the side on which the lens is provided; a fourth process of placing a first partition, on the glass substrate, the first partition being for partitioning a gap between lenses and higher than a height of the lens; a fifth process of placing the glass substrate above the side of the lens sheet on which the lens is formed such that the first partition is located on a lower side of the glass substrate; a sixth process of bonding the lens sheet and the glass substrate by injecting adhesive between the lens sheet and the glass substrate; a seventh process of removing the base material from the lens sheet; an eighth process of placing, (i) on a side of the base opposite to the side on which the lens is provided and (ii) corresponding to the first partition, a second partition for partitioning the gap between the lenses corresponding to, among the pixel units, pixel units which emit light in different colors; a ninth process of filling a resin which selectively transmits blue light in a gap between second partitions corresponding to a pixel unit, among the pixel units, which at least includes an organic luminescent layer which emits blue light; and a tenth process of bonding the sealing layer and the resin filled between the second partitions by injecting adhesive on the sealing layer.

As such, the aspect is for providing the first partition on the lens sheet after providing, on the base of the lens sheet, the base material for reinforcing the base. Thus, it is possible to prevent the distortion in the lens sheet in the manufacturing process when setting the first partition, for example, thereby preventing degradation in optical characteristics of the lens sheet caused by the distortion in the lens sheet.

Furthermore, according to this aspect, the base material is removed after connecting the lens sheet and the glass substrate via the first partitions. With this, the lens sheet is fixed with the glass substrate via the first partitions. Thus, it is possible to maintain the shape of the lens sheet after the base material is removed. Therefore, it is not necessary for the display panel apparatus manufactured according to the manufacturing method of this aspect to provide a material for reinforcing the lens sheet such as the base material; that is, it is possible to reduce the layers present between the glass substrate and the organic EL unit. Consequently, the light-extraction efficiency can be improved.

In addition, in an aspect of the manufacturing method of the display panel apparatus according to the present invention, it is preferable to include an eleventh process of forming, between the third process and the fifth process, a trench (i) formed along a perimeter of a region of the base where the lens is formed and (ii) recessed from a surface of the base in a direction opposite to a protruding direction of the lens; and a twelfth process of inserting, between the fifth process and the sixth process, the first partition into the trench on the lens sheet.

With this structure, it is possible to project the first trench inserted into the trench on the bottom surface of the lens sheet (on the side where the lens is not provided), when placing the second partition on the lens sheet after the first partition is inserted into the trench of the lens sheet. This allows the positions of the first partitions to be recognized, thereby facilitating a process for determining the positions to place the second partitions. Therefore, it is possible to align the second partitions with the first partitions highly precisely.

In addition, in an aspect of the manufacturing method of the display panel apparatus according to the present invention, it is preferable to include a thirteenth process of flipping, between the seventh process and the eighth process, the lens sheet upside down, in which, in the eighth process, the second partition is formed with a bottom surface of the lens sheet being an uppermost surface.

As such, after the glass substrate is placed such that the first partition is provided on the upper surface of the base, the lens sheet is flipped upside down. With this, the first partition inserted into the trench can be projected on the bottom surface of the lens sheet. Thus, the position of the first partition can be easily recognized by seeing the lens sheet from above. Placing the second partition in this state facilitates the alignment of the first partition and the second partition.

In addition, in an aspect of the manufacturing method of the display panel apparatus according to the present invention, it is preferable that, in the fourth process, the glass substrate is placed in contact with an end of the first partition.

This structure allows the end of the first partition to connect the lens sheet and the glass substrate. Thus, the lens sheet is not distorted. With this, it is possible to stably fix the lens sheet with the glass substrate. Thus, it eliminates the necessity for providing the base material and others on the bottom surface of the lens sheet for reinforcing the lens sheet in the completed display panel apparatus. The display panel apparatus capable of improving the light-extraction efficiency can therefore be implemented.

Furthermore, another aspect of the manufacturing method of the display panel apparatus according to the present invention includes a first process of preparing pixel units having a first electrode, a second electrode, and an organic luminescent layer which is interposed between the first electrode and the second electrode and emits red, green or blue light; a second process of forming, above the second electrode, a sealing layer for sealing the pixel units; a third process of preparing a lens sheet having a lens provided corresponding to each of the pixel units, a base on which the lens protruding from the base is formed, and a base material for reinforcing the base on a side of the base opposite to the side on which the lens is provided; a fourth process of bonding a substrate and a side of the base material opposite to the side on which the base of the base material is bonded; a fifth process of forming, on the glass substrate, partitions for partitioning a gap between lenses; a sixth process of forming, between the lenses, holes for inserting the partitions formed on the glass substrate into a bottom of the base material; a seventh process of placing the partitions to be at least higher than a height of the lens by inserting the partitions into the holes; an eighth process of bonding the lens sheet and the glass substrate by injecting adhesive between the lens sheet and the glass substrate; a ninth process of removing the base material from the lens sheet and removing the base material between the partitions from the lens sheet; a tenth process of filling a resin which selectively transmits blue light in a gap between partitions extending to the pixel units and corresponding to a pixel unit which at least includes an organic luminescent layer which emits blue light among the pixel units; and an eleventh process of bonding the sealing layer and the resin filled between the partitions extending to the pixel units by injecting adhesive on the sealing layer.

In the present embodiment, partitions between lenses penetrate the base of lens sheet and extend to the pixel units. In addition, according to this aspect, a gap between partitions corresponding to the pixel unit including at least the organic luminescent layer which emits blue light is filled with a resin which selectively transmits blue light. This allows the partitions extending to the pixel unit to serve as a guide for flowing in the resin. Thus, it is possible to fill the resin in the gaps between the partitions, making the thickness of the resin flat by a simple process. Thus, compared to the case where the color filters are formed by separate material between the lens and pixel unit, the manufacturing process can be simplified, thereby reducing the manufacturing cost.

As described above, according to the display panel apparatus according to the present invention, the first partition and the second partition prevents the reflected light reflected on the glass substrate from entering the adjacent luminescent region. Therefore, the contrast of the image can be improved.

Furthermore, according to the manufacturing method of the display panel apparatus according to the present invention, the display panel apparatus can be manufactured without degrading the optical characteristics of the lens sheet.

The following describes the display panel apparatus and the manufacturing method of the display panel apparatus according to embodiments of the present invention with reference to the drawings. Needless to say, the present invention is not limited to the following embodiments. In addition, the diagrams are schematic diagrams for explanation, and the ratios of thickness and the dimension of each component is not always strictly accurate.

First Embodiment

First, the following describes the display panel apparatus according to the first embodiment of the present invention. FIG. 1 is a planar view of the display panel apparatus according to the first embodiment of the present invention.

As illustrated in FIG. 1, the display panel apparatus 1 according to the first embodiment of the present invention includes luminescent regions formed in a row direction and a column direction orthogonal to the row direction (in a matrix). The luminescent regions include a luminescent pixel unit (hereafter simply referred to as "pixel unit") 12 for each luminescent region. Thus, the pixel units 12 are arranged in the row direction and the column direction orthogonal to the row direction on the luminescent regions. Each pixel unit 12 includes a pixel unit 12R which emits red light (hereafter referred to as "red pixel unit", a pixel unit 12G which emits green light (hereafter referred to as "green pixel unit"), and a pixel unit 12B (hereafter referred to as "blue pixel unit").

As such, the pixel units which emit the light in the same color are repeatedly arranged in the column direction. In the row direction, the red pixel unit 12R, the green pixel unit 12G, and the blue pixel unit 12B are repeatedly arranged in this order. The luminescent regions include the red pixel unit 12R, the green pixel unit 12G, and the blue pixel unit 12B and are a region where each pixel unit 12 emits light. The luminescent region corresponding to the red pixel unit 12R is a red luminescent region, the luminescent region corresponding to the green pixel unit 12G is a green luminescent region, and a luminescent region corresponding to the blue pixel unit 12B is a blue luminescent region. The region between the red pixel unit 12R and the blue pixel unit 12B is a non-luminescent region where the pixel unit 12 is not formed and there is no luminescent light.

The lens 22 is formed for each pixel unit 12 corresponding to the pixel units 12. The lens 22 is for converging light emitted from the organic luminescent layer in the red pixel unit 12R, the green pixel unit 12G, or the blue pixel unit 12B. Note that the lens for the red pixel unit 12R is referred to as lens for red 22R, lens for the green pixel unit 12G is referred to as lens for green 22G, and lens for the blue pixel unit 12B is referred to as lens for blue 22B.

Furthermore, the first partitions 25 are provided between the lenses 22 each of which corresponds to each pixel unit 12. The first partitions 25 are provided such that the light in different color does not enter adjacent luminescent regions. More specifically, the first partitions 25 are provided between the lens for red 22R and the lens for green 22G, and between the lens for green 22G and the lens for blue 22B. In other words, the first partitions 25 are provided on both sides of the lens 22 such that the lens for red 22R, the lens for green 22G, and the lens for blue 22B are interposed. Note that, second partitions 26 (not illustrated) which will be described later are provided below the first partitions 25.

Figure 2:
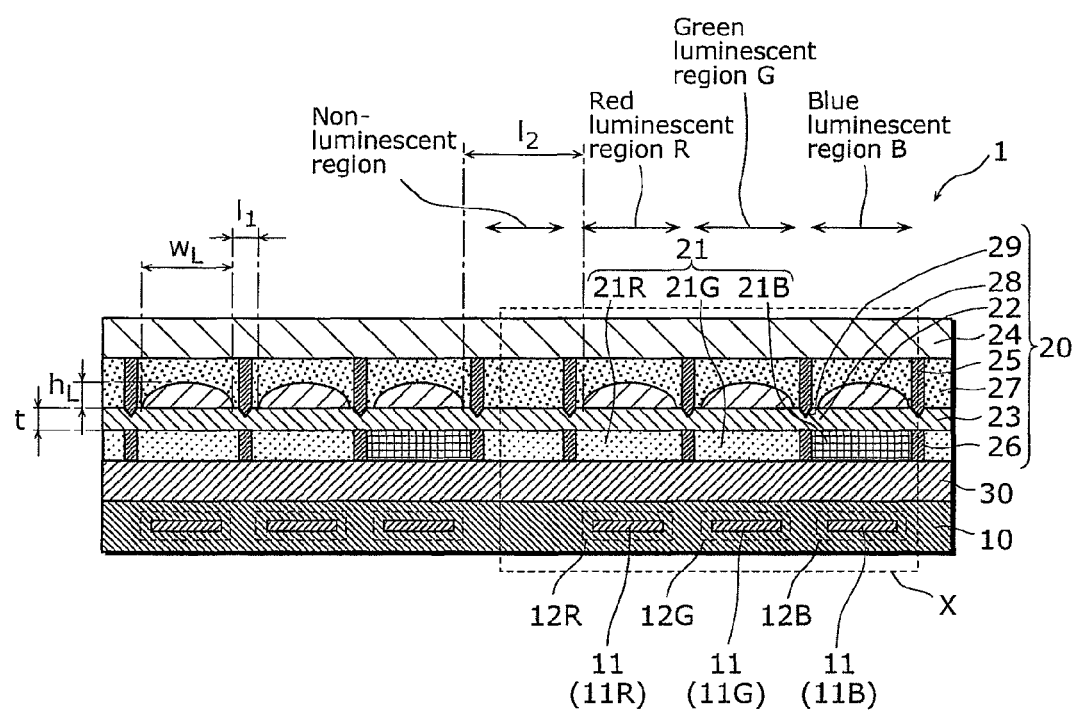
FIG. 2 is a cross-section of a display panel apparatus along the line A-A' illustrated in FIG. 1 according to the first embodiment of the present invention.

FIG. 2 is a cross-section of a display panel apparatus along the line A-A' illustrated in FIG. 1 according to the first embodiment of the present invention.

As shown in FIG. 2, the display panel apparatus 1 according to the first embodiment of the present invention has the organic EL unit 10 and the lens unit 20 bonded by a sealing resin 30.

The organic EL unit 10 includes the organic luminescent layer 11 which emits predetermined light, and includes an organic luminescent layer 11R (hereafter referred to as "red organic luminescent layer") which emits red light, an organic luminescent layer 11G which emits green light (hereafter referred to as "green organic luminescent layer"), and an organic luminescent layer 11B which emits blue light (hereafter referred to as "blue organic luminescent layer"). In addition, the red organic luminescent layer 11R, the green organic luminescent layer 11G, and the blue organic luminescent layer 11B are included in the red pixel unit 12R, the green pixel unit 12G, and the blue pixel unit 12B, respectively. Note that, the pixel unit 12 in the organic EL unit 10 includes a first electrode (not illustrated) and a second electrode (not illustrated), and the organic luminescent layers, that is, the red organic luminescent layer 11R, the green organic luminescent layer 11G, and the blue organic luminescent layer 11B are interposed between the first electrode and the second electrode. More detailed structure of the organic EL unit 10 shall be described with reference to FIG. 3.

The lens unit 20 includes the color filter unit 21, the lens sheet 23 including the lens 22 and the glass substrate 24 (cover plate). The lens unit 20 further includes the first partitions 25 and the second partitions 26. A bonding layer 27 is formed between the lens sheet 23 and the glass substrate 24.

The color filter unit 21 is composed of the color filter for red 21R formed corresponding to the red pixel unit 12R, the color filter for green 21G formed corresponding to the green pixel unit 12G, and the color filter for blue 21B formed corresponding to the blue pixel unit 12B. In this embodiment, the color filter for red 21R is made of a transparent resin with 95% or more and less than 100% of transmission factor of light. The color filter for green 21G is also made of a transparent resin with 95% or more and less than 100% of transmission factor of light. In contrast, the color filter for blue 21B is made of a resin which selectively transmits blue light.

The use of transparent resin for the color filter for red 21R and the color filter for green 21G suppresses the reduction in the amount of red or green light emitted above the lens 22. The use of transparent resin for the color filter for red 21R and the color filter for green 21G prevents the change in the optical characteristic of the lens sheet 23 due to distortion.

Note that, colored transparent filters, dichroic mirrors, and bandpass filters may be used as the filter. Furthermore, organic pigment, particle added organic pigment, metal oxide and resins including the metal oxide may be used as the material for the filter. The filter may also include inorganic or organic fluorescent pigment. With the filter, the color of the light emitted from the organic luminescent layer of the organic EL unit 10 can be converted, allowing adjustment on the display performance of the display panel such as color reproducibility.

The lens sheet 23 is composed of a thin, soft material. Thus, when no material is provided for supporting the lens sheet 23, there is a possibility that the lens sheet 23 is distorted. As described in this embodiment, filling the transparent resin between the second partitions corresponding to the red pixel units 12R and the green pixel units 12G securely fixes the lens sheet with the transparent resin. Thus, the distortion in the lens sheet 23 is prevented. This prevents the change in the optical characteristics of the lens sheet 23, achieving desired optical extraction efficiency.

The lens sheet 23 interposed between the organic EL unit 10 and the glass substrate 24, and has lenses 22 and a base 28 on which the protruding lenses are formed. The lens sheet 23 is formed with a sheet-shaped base 28 and the lenses 22 made of acrylic resin such as polymethylmethacrylate resin (metacrylate resin). The lenses 22 are formed to correspond to all of the pixel units 12, respectively, and one lens 22 is formed for one pixel unit 12. More specifically, the lens for red 22R is formed for the red pixel unit 12R, the lens for green 22G and the lens for blue 22B are formed for the green pixel unit 12G and the blue pixel unit 12B, respectively. The lenses 22 in the pixel units 12 condense the light emitted from the organic luminescent layers 11. This increases the efficiency of extracting light.

The cross-section of the lens 22 has an elliptic arc shape having a predetermined curvature factor as shown in FIG. 2. The shape of the lenses 22 in a planar view is rectangular elongated in the column direction as illustrated in FIG. 1. That is, the lens 22 has a semi-cylindrical shape.

Note that, in this embodiment, the lens 22 is arranged corresponding to one of the pixel units 12 as illustrated in FIG. 1. However, lenticular lens may also be used as a shared lens for the pixel units 12 of the same color formed in the column direction.

The glass substrate 24 is arranged above the organic EL unit 10. In addition, the glass substrate 24 constitutes the external surface of the display panel apparatus 1, and the light emitted from the organic luminescent layer 11 is radiated outside the display panel apparatus 1 through the glass substrate 24.

The first partitions 25 for partitioning the gap between the lenses provided for the pixel units 12 on a side of the lens sheet 23 on which the lenses 22 are formed. The first partitions 25 are arranged between the lens sheet 23 and the glass substrate 24. In this embodiment, the first partitions 25 are formed such that the end of the first partition on the glass substrate side contacts the glass substrate 24.

As described above, the first partitions 25 contact the glass substrate 24. Thus, the adjacent luminescent regions between the glass substrate 24 and the base 28 can be completely blocked. This securely prevents the light reflected on the glass substrate 24 from traveling toward the adjacent luminescent region.

Furthermore, the first partitions 25 contact the glass substrate 24, and thus the lens sheet 23 is fixed to the glass substrate. This prevents the distortion of the lens sheet 23 and achieves stable light-extraction efficiency. The shape of the lens 22 collapses when only supported by the base 28 because the base 28 is very thin compared to the lens 22; it is difficult for only the base 28 to support the shape of the lens 22. For this reason, a base material for reinforcing the base 28 is conventionally provided under the base 28; however, the base material inhibits the light-extraction efficiency. In contrast, according to this embodiment, the first partitions 25 connect the base 28 and the glass substrate 24. Thus, the lens sheet 23 is fixed by the first partitions 25 and the glass substrate 24. Thus, it is not necessary to provide the base material under the lens sheet 23. This allows extracting more light emitted from the organic luminescent layers 11 in the pixel unit 12 than the conventional technique, thereby improving the light-extraction efficiency.

The display panel apparatus according to this embodiment has a structure in which the height of the first partitions 25 is at least higher than the height of the lens 22. As described above, setting the height of the first partitions 25 higher than the height of the lens 22 prevents the light totally reflected by the glass substrate 24 from entering the adjacent luminescent region. It also prevents the glass substrate 24 from damaging the lens 22. As described above, the first partitions 25 blocks the light entering the adjacent luminescent region, in addition to the light-condensing effect of the lens 22. Thus, the stray light can be reduced and the color mixture can be prevented.

In addition, second partitions 26 for partitioning the lens units 20 corresponding to the pixel units 12 are provided on a side of the lens sheet 23 opposite to the side on which the lenses 22 are formed (on a side on which the lenses are not provided). The second partitions 26 are arranged between the pixel units 12 and the lens sheet 23. The edge of the second partitions 26 on the lens sheet side is arranged corresponding to the first partitions 25 and contacts the lens sheet 23. More specifically, the first partitions 25 and the second partitions 26 are facing each other interposing the base 28 of the lens sheet 23.

According to the present invention, both the first partitions 25 and the second partitions 26 are made of a photo-absorptive material. For example, the first partitions 25 and the second partitions 26 can be made of carbon black. Furthermore, in this embodiment, the first partitions 25 and the second partitions 26 have the same width. Thus, when the second partitions 26 are set to face the first partitions 25, the second partitions 26 entirely overlap the first partitions 25 in a planar view of the display panel apparatus. Note that the side of the second partitions on the pixel unit side contacts the sealing resin 30.

Predetermined resins corresponding to the pixel units 12 are filled in the gaps between the second partitions 26. More specifically, the transparent resin having 95% or higher and less than 100% of transmission factor of light is filled in the gaps between the second partitions 26 corresponding to the red pixel unit 12R. The transparent resin having 95% or higher and less than 100% of transmission factor of light is filled in the gaps between the second partitions corresponding to the green pixel unit 12G. The resin that selectively transmits the blue light is filled in the gaps between the second partitions 26 corresponding to the blue pixel unit 12B.

A bonding layer 27 is filled between the lens sheet 23 and the glass substrate 24. The bonding layer 27 is formed over the base 28 and the top of the lenses 22, and is for planarizing the irregularity due to the lenses 22 and bonding the lens sheet 23 and the glass substrate 24. The lenses 22 and the glass substrate 24 do not contact each other directly. The bonding layer 27 exists in the gaps between the lens 22 and the glass substrate 24. The bonding layer 27 is made of a resin made from low refractive index, and the lens 22 is made of a high refractive index material. More specifically, when the optical refractive index of the lens 22 is n1 and the optical refractive index of the bonding layer 27 is n2, n1>n2 is satisfied. The light emitted from the organic luminescent layer 11 and transmitted the color filter unit 21 is condensed, using the difference in the refractive indices of the lens 22 and the bonding layer 27 and the shape of the lens 22.

In addition, according to this embodiment, the lens sheet 23 has trenches 29. The trenches 29 are recessed in a direction opposite to the protruding direction of the lens 22 from the surface of the base 28. The trenches 29 are formed along the perimeter of a region in the base 28 where the lenses 22 are provided. More specifically, in a planar view of the display panel apparatus 1, the trenches are arranged in stripes along the column direction of the perimeter of the lenses 22 in the base 28 in the region where the lenses are formed. In addition, the cross-section of the trench 29 takes the form of V-shape, as illustrated in FIG. 2.

The tip of the first partition 25 on the lens sheet side has a triangle shape in cross-section. As such, the tips of the first partitions 25 are shaped to fit the shape of the trenches 29 in the lens sheet 23, and inserted into the trenched 29 in the lens sheet 23. As described above, in this embodiment, part of the first partitions 25 are inserted into the lens sheet 23. The second partitions 26 are arranged on the opposite side of the side of the base 28 where the lenses 22 are provided, in such a manner that the second partitions 26 are aligned with the portions of the first partitions 25 inserted into the trenches 29.

The tips of the first partitions 25 inserted into the trenches on the lens sheet 23 as described above blocks light such as the light reflected on the glass substrate 24 from entering the adjacent luminescent region through the base 28 of the lens sheet 23. The first partitions 25 in this embodiment are made of a photo-absorptive material. Thus, the light reaching the tips of the first partitions 25 inserted into the trenches 29 is absorbed by the tips.

Furthermore, the structure in which part of the first partitions 25 are inserted into the trenches 29 in the lens sheet 23 facilitates highly-precise arrangement of the second partitions 26. More specifically, in a manufacturing process for arranging the second partitions 26 on the lens sheet 23 after the first partitions 25 are inserted to the trenches 29 of the lens sheet, the first partitions 25 inserted into the trenches 29 are projected onto the bottom surface of the lens sheet 23 (the surface where the lenses are not provided). Thus, it is possible to recognize the positions of the first partitions 25, which facilitates identifying the positions for arranging the second partitions 26. Therefore, it is possible to align the first partitions 25 and the second partitions 26 highly precisely. More specifically, the trenches 29 are also used as markers for aligning the first partitions 25 and the second partitions 26, that is, the second partitions 26 can be easily and highly precisely aligned, using the first partitions 25 inserted into the lens sheet 23 as the markers (alignment marks).

Note that, the first partitions 25 are arranged on the trenches 29 by self alignment using the trenches 29 of the lens sheet 23.

Figure 3:
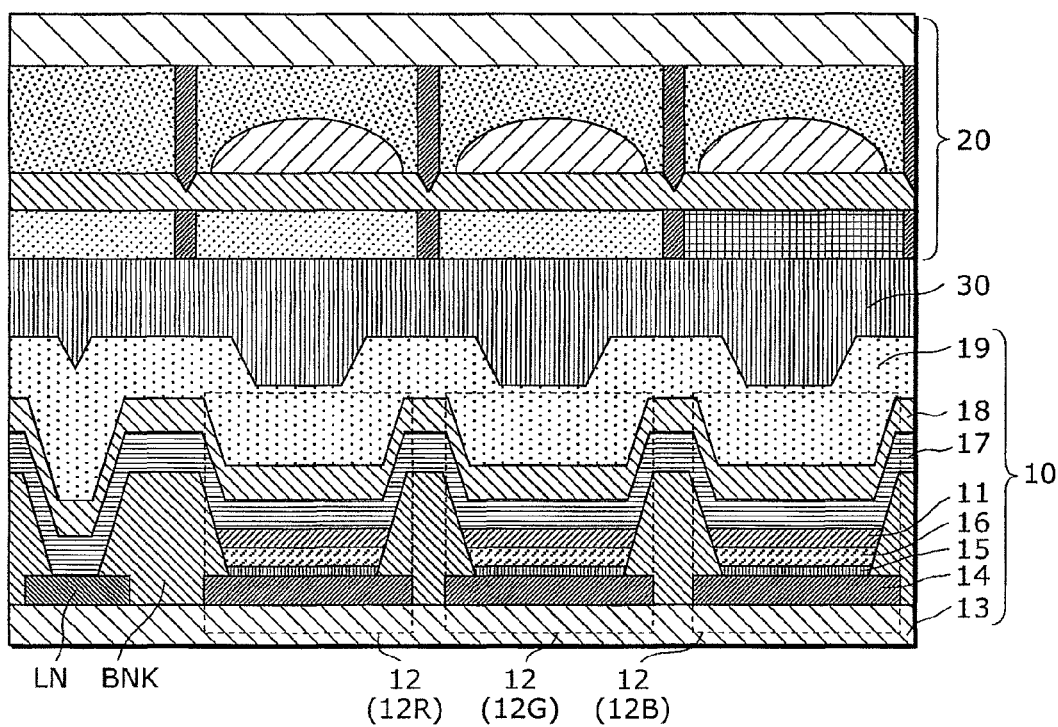
FIG. 3 is a cross-section of the display panel apparatus according to the first embodiment of the present invention illustrating an area surrounded by the broken line X in FIG. 2 enlarged.

The detailed structure of the organic EL unit 10 shall be described in detail with reference to FIG. 3. FIG. 3 is a cross-section of the display panel apparatus according to the first embodiment illustrating the area surrounded by the broken line X in FIG. 2 enlarged.

As illustrated in FIG. 3, the organic EL unit 10 includes a first electrode 14 (lower electrode) formed on the planarizing firm of the substrate 13, a hole injection layer 15, a hole transport layer 16, and organic luminescent layer 11, an electron transport layer 17, a second electrode 18 (upper electrode) and a sealing thin-film 19 that are sequentially formed in this order on the substrate 13 on which a planarizing film (not illustrated) is formed in each pixel unit 12.

The substrate 13 with the planarizing film is formed by forming the planarizing film for planarizing the top surface of a TFT layer (not illustrated) formed on the substrate 13.

The first electrode 14 is a repeller that serves as an anode, and a portion of the first electrode 14 is separately formed for each pixel unit. More specifically, the first electrodes 14 are formed for each of the red pixel units 12R, the green pixel units 12G and the blue pixel units 12B.

The hole injection layer 15 is capable of injecting holes into the hole transport layer 16, and is made of a predetermined organic material. In addition, the hole transport layer 16 is capable of transporting holes to the organic luminescent layer, and is made of a predetermined organic material. The hole injection layer 15 and the hole transport layer 16 are separately formed for each pixel unit.

The organic luminescent layer 11 in each pixel unit 12 is made of an organic material with a predetermined electroluminescent property. The organic luminescent layer 11 is separately formed for each pixel unit 12, and a red organic luminescent layer 11R, a green organic luminescent layer 11G and a blue organic luminescent layer 11B are provided for the red pixel unit 12R, the green pixel unit 12G, and the blue pixel unit 12B, respectively.

The electron transport layer 17 is capable of transporting electrons to the organic luminescent layer 11, and is made of a predetermined organic material.

The second electrode 18 is a transparent electrode that serves as a cathode, and is made of conductive material such as indium tin oxide (ITO), facing the first electrodes 14. The second electrode 18 is shared by the pixel units 12.

The sealing thin-film 19 is a layer for sealing the pixel units 12, and is made of thin-film transparent insulating material.

Figure 4:
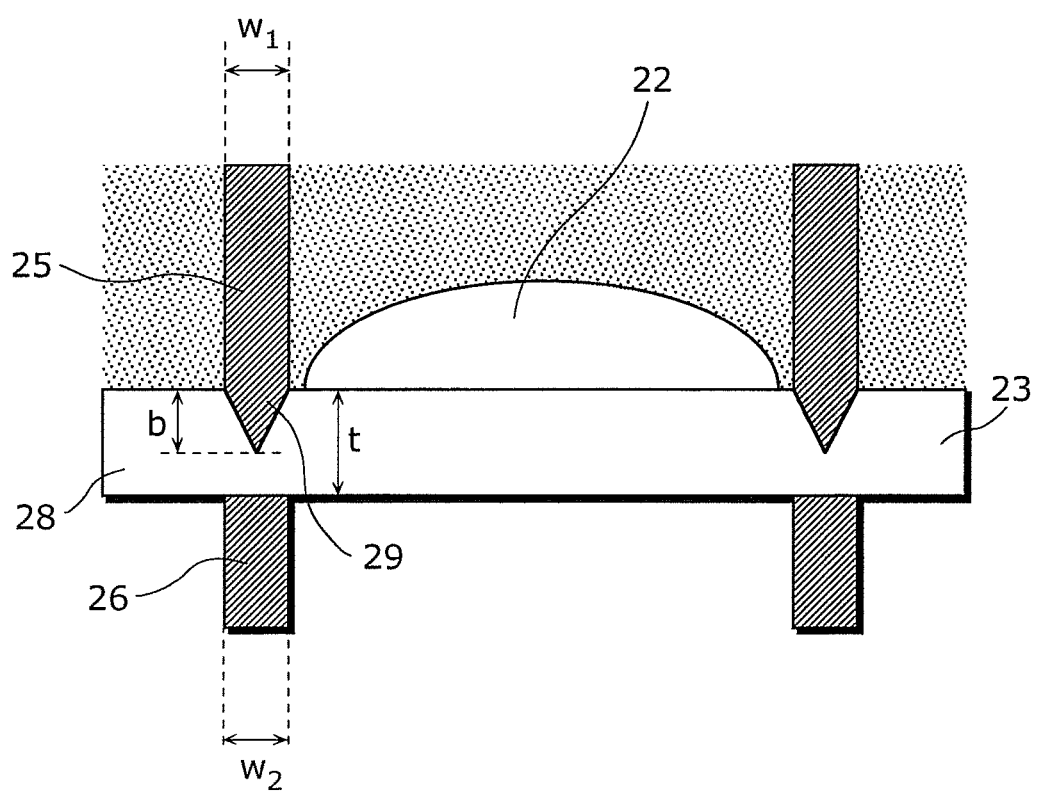
FIG. 4 is a partial enlarged cross-section view of a display panel apparatus according to the first embodiment of the present invention.

Note that, banks BNK for partitioning the first electrodes 14, the hole injection layer 15, the hole transport layer 16, and the organic luminescent layer 11 are provided between the pixel units 12 in each color. The banks BNK are made of photosensitive resin. Lines LN are arranged in the non-luminescent region in which the organic luminescent layer is not formed. Note that, in this embodiment, the banks BNK are formed only in the column direction for partitioning the pixel units 12 by color in the same manner as the second partitions 25 in FIG. 1. However, the banks BNK may also be formed in a grid for partitioning the pixel units 12 in the same color as well. Next, the dimensions of the first partitions 25 and the second partitions 26 shall be described in detail with reference to FIG. 4. FIG. 4 is a partial enlarged cross-section view of a display panel apparatus according to the first embodiment of the present invention.

As illustrated in FIG. 4, when the width of the first partition 25 is $w_1$, the width of the second partition is $w_2$, and the thickness of the base 28 is t, it is preferable that the first partition 25 to have $w_1/t$ being three or more and 50 or less. It is also preferable that the second partition 26 to have $w_2/t$ being three or more and 50 and less. This prevents light such as the light reflected on the glass substrate 24 from leaking through the base 28 to the adjacent luminescent region to the fullest extent.

When the distance from the end of the tip of the first partition 25 inserted into the trench 29 in the lens sheet 23 to the top surface of the base 28 in a direction vertical to the main surface of the base 28 is b, it is preferable that b/t is 0 or more and ⅔ or less. With this, the light that enters the adjacent luminescent region through the base 28 of the lens sheet 23 is absorbed by the tip of the first partition 25 inserted into the lens sheet 23, and is blocked from traveling. In addition, this structure keeps the shape of the lens sheet 23 maintained even if the strength of the lens sheet 23 is decreased due to the trenches 29. As described above, in this embodiment, the trenches 29 in the lens sheet 23 are not only effective for the alignment process but also for the factor in determining the distance to the second partitions 26. The trenches 29 are also effective for blocking light passing between the first partitions 25 and the second partitions 26.

Figure 5:
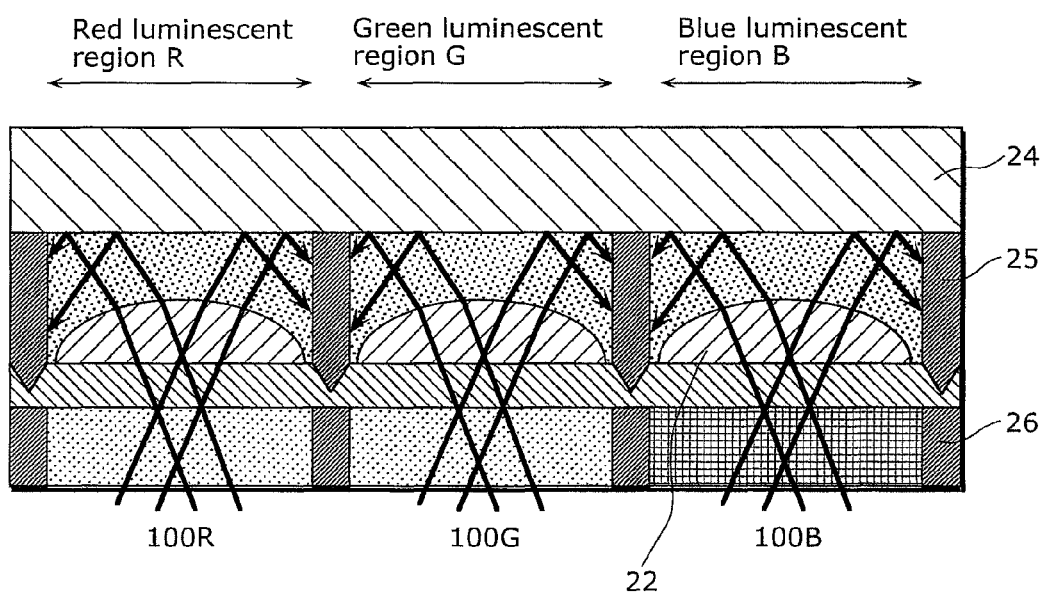
FIG. 5 illustrates traveling light emitted from the organic luminescent layer in the display panel apparatus according to the first embodiment of the present invention.

Next, the effect achieved by the display panel apparatus 1 according to the first embodiment of the present invention using FIG. 5. FIG. 5 illustrates traveling light emitted from the organic luminescent layer in the display panel apparatus according to the first embodiment of the present invention.

The display panel apparatus 1 according to the first embodiment of the present invention has first partitions higher than the height of the lenses 22 between the lenses 22. Thus, among the light emitted from the red organic luminescent layer 11R and transmitted the color filter for red R, light 100R which is completely reflected on the glass substrate 24 is blocked by the first partitions 25. Similarly, among the light emitted from the green organic luminescent layer 11G and the blue organic luminescent layer 11B, light 100G and 100B which are completely reflected on the glass substrate 24 are absorbed by the first partitions 25 and are also blocked from traveling.

As such, it is possible to prevent the light reflected on the glass substrate 24 from traveling to the adjacent luminescent region, by the first partitions 25. More specifically, it is possible to prevent the light from entering the adjacent luminescent region. Note that, the effect of the first partitions 25 on the light completely reflected from the glass substrate 24 described above can also be achieved by the second partitions 26. More specifically, when the light reflected on the glass substrate reaches the second partitions 26, the second partitions 26 block the reflected light from traveling, and prevent the reflected light traveling toward the adjacent luminescent region.

Furthermore, the first partitions and the second partitions are made of photo-absorptive material. Thus, the stray light which is the light emitted from the organic luminescent layer 11 directly heading for the pixel unit 12 in different color can be absorbed. In addition, the external light entering from outside of the display panel apparatus 1 may also be absorbed, as illustrated in FIG. 7. The following is the detailed description of FIGS. 6 and 7.

Figure 6:
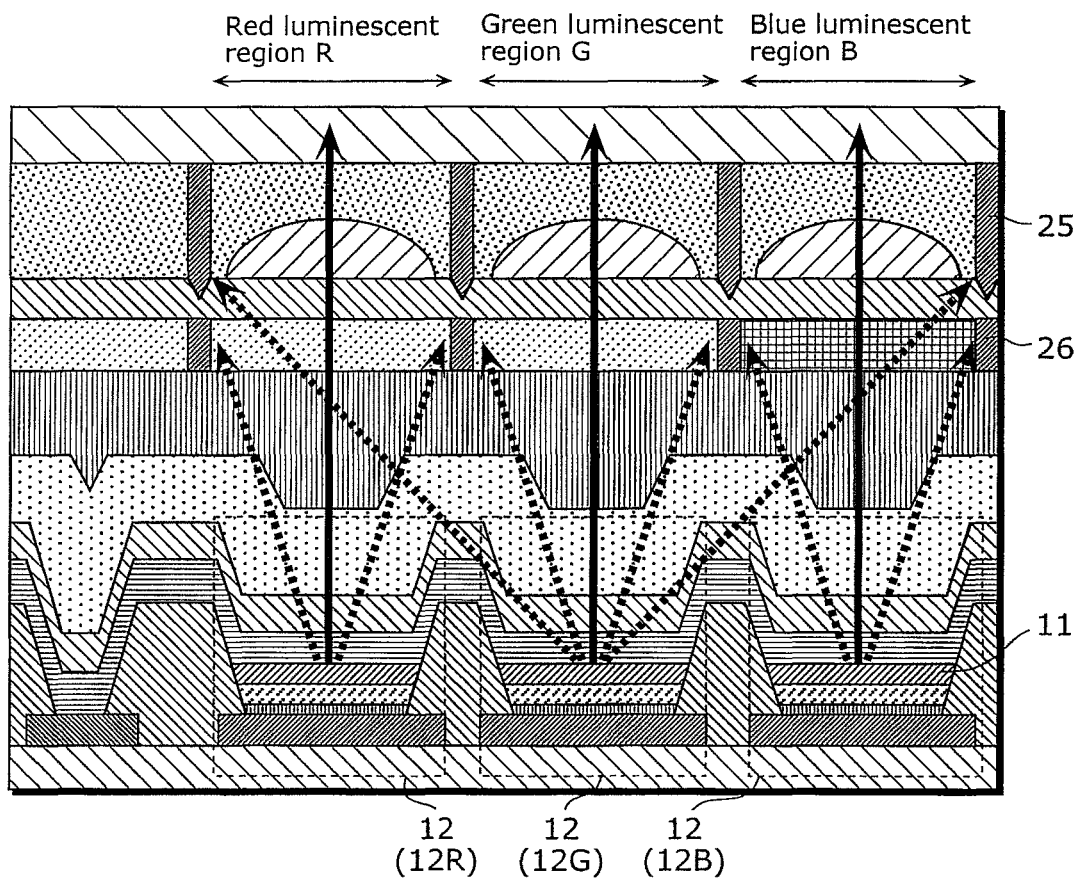
FIG. 6 illustrates traveling stray light in the display panel apparatus according to the first embodiment of the present invention.
Figure 7:
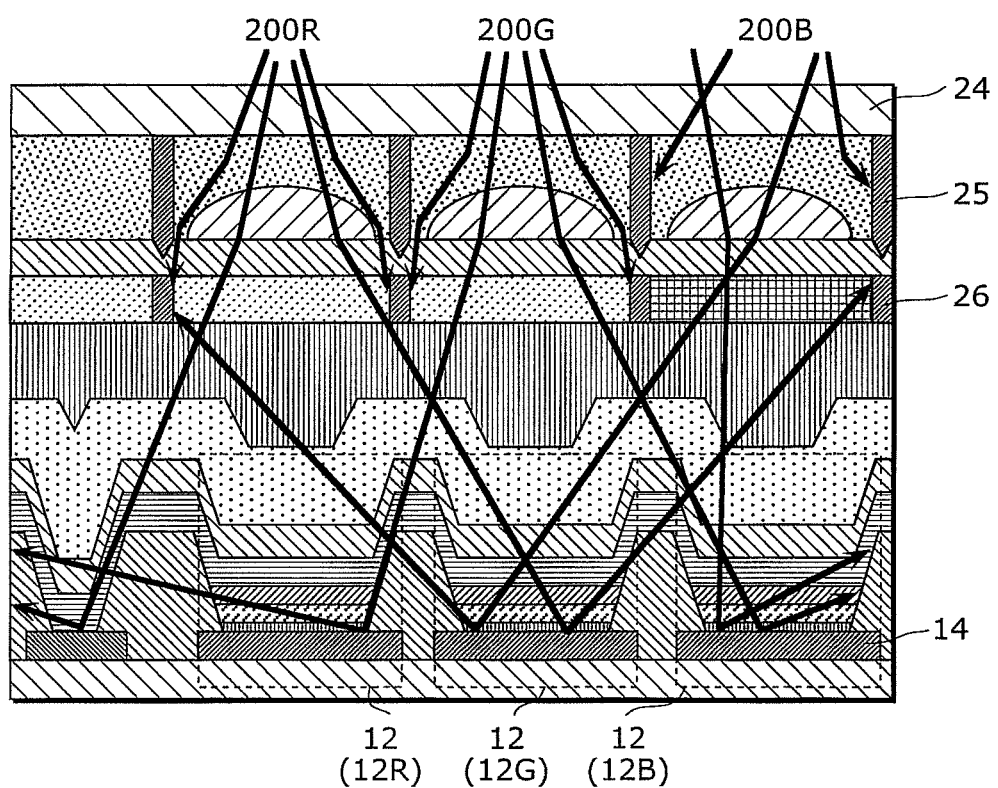
FIG. 7 illustrates traveling external light in the display panel apparatus according to the first embodiment of the present invention.

As illustrated in FIG. 6, the stray light among the light emitted from the organic luminescent layer in the pixel units of the red pixel unit 12R, the green pixel unit 12G, and the blue pixel unit 12B and directly heading for the pixel unit in different color is absorbed by the first partitions 25 and the second partitions 26. With this, the stray light attempting to enter the other luminescent region can be blocked. Note that, the arrows in broken lines in FIG. 6 indicate the stray light.

In addition, as illustrated in FIG. 7, the external light 200R, 200G, and 200B entering from outside of the display panel apparatus 1 is absorbed by the first partitions 25 and the second partitions 26. With this, the second partitions 26 also serve as the black matrix as the first partitions 25. Thus, the external light 200R, 200G, and 200B that entered inside the display panel apparatus 1 can be blocked from reaching the adjacent pixel unit 12. Furthermore, the external light 200R, 200G, and 200B that entered inside the display panel apparatus 1 reflects on the first electrodes 14 and travels in a direction toward outside. However, the second partitions 26 absorb the light reflected on the first electrodes 14. Thus, the external light 200R, 200G, and 200B traveling inside can be inhibited from reflecting on the first electrodes 14 and exit to outside again.

As such, composing the first partitions 25 and the second partitions 26 of the photo-absorptive material improves the contrast in the display image.

As described above, the display panel apparatus 1 according to the first embodiment of the present invention has the first partitions 25 provided between the lens sheet 23 and the glass substrate 24, and setting the height of the first partitions 25 at least higher than the height of the lens. Furthermore, the second partitions 26 are arranged aligned with the first partitions 25 on the opposite side of the side of the base 28 of the lens sheet 23 on which the lens 22 is provided.

As such, the display panel apparatus 1 according to this embodiment has the first partitions 25 higher than the height of the lens. Thus, it is possible to prevent the light reflected on the glass substrate among the light emitted from the organic luminescent layer 11 included in the pixel unit 12 (the first pixel unit) corresponding to one color partitioned by the first partitions 25 and the second partitions 26 traveling toward a second luminescent region corresponding to another color and adjacent to the first luminescent region corresponding to the first pixel unit. In other words, the first partitions 25 and the second partitions 26 block the light traveling from the first luminescent region to the second luminescent region. This prevents the light emitted from the organic luminescent layer in the first pixel unit in the first luminescent region from entering the second luminescent region which is adjacent to the first luminescent region. Thus, it is possible to prevent the colors of the emitted light to be mixed in a different luminescent region, improving the contrast in image.

Figure 8:
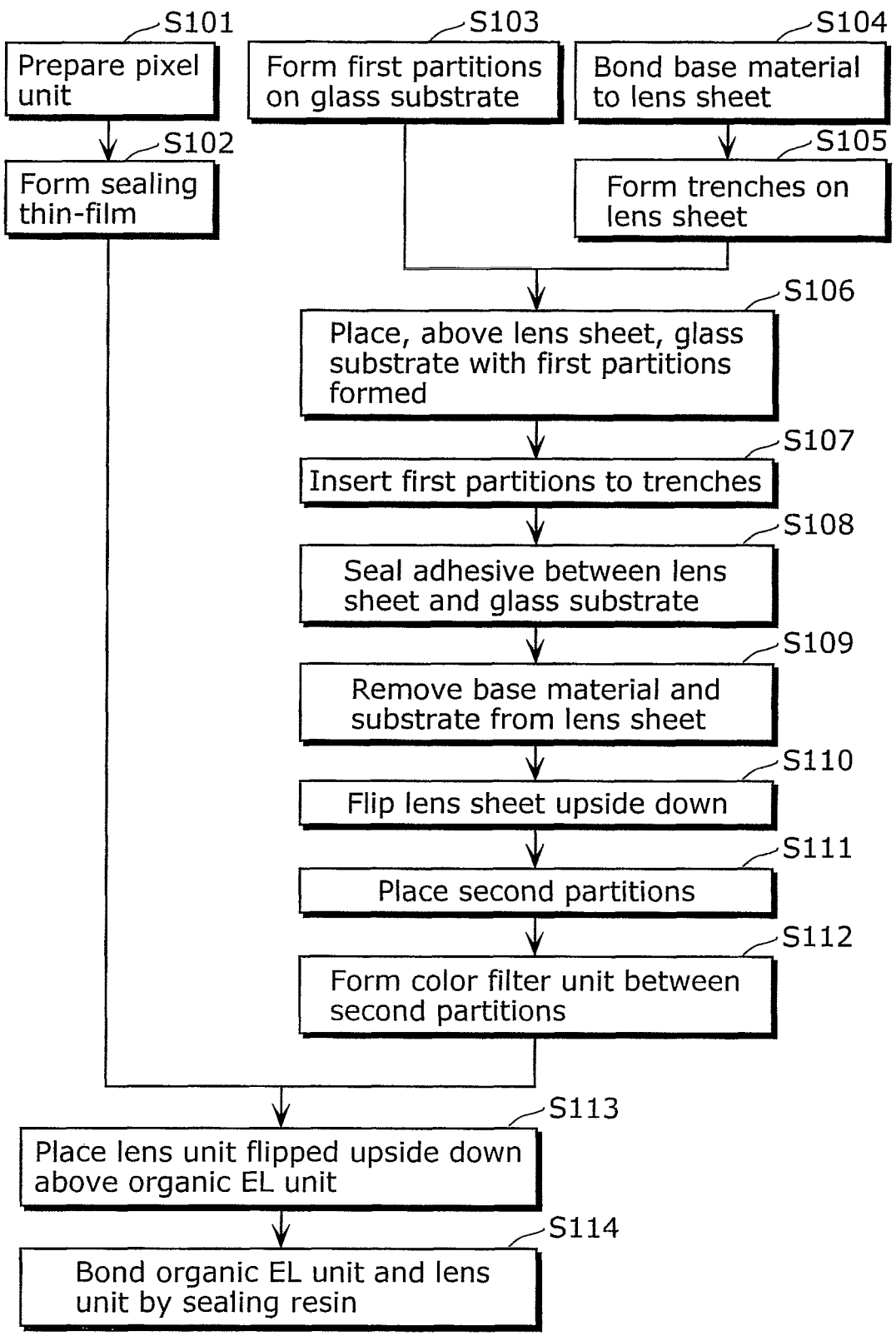
FIG. 8 is a flowchart illustrating a display panel apparatus according to the first embodiment of the present invention.

Next, the manufacturing method of the display panel apparatus 1 according to the first embodiment shall be described with reference to FIG. 3 and using FIGS. 8 and 9A to 9K. FIG. 8 is a flowchart illustrating the manufacturing method of the display panel apparatus according to the first embodiment of the present invention. FIGS. 9A to 9K are cross-section of the components of the display panel apparatus in each process of the manufacturing method of the display panel apparatus according to the first embodiment of the present invention.

As illustrated in FIG. 8, the pixel units 12 including the red organic luminescent layer 11R, the green organic luminescent layer 11G, and the blue organic luminescent layer 11B interposed between the first electrodes 14 and the second electrode 18 are formed on the substrate 13 on which a TFT layer and the planarizing film for planarizing the surface of the TFT layer (S101).

Next, the sealing thin-film 19 which serves as a sealing layer for sealing the pixel units 12 is formed above the second electrode 18 (S102). With this, the organic EL unit 10 is prepared.

Figure 9A:
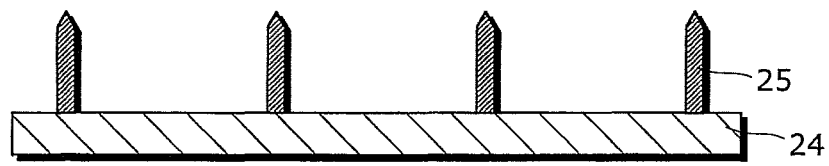
FIG. 9A illustrates a process in step 103 of the manufacturing method of the display panel apparatus according to the first embodiment of the present invention.
Figure 9B:
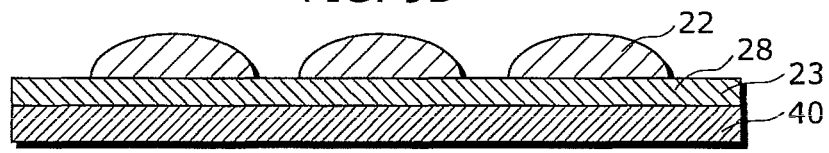
FIG. 9B illustrates a process in step 104 of the manufacturing method of the display panel apparatus according to the first embodiment of the present invention.
Figure 9C:
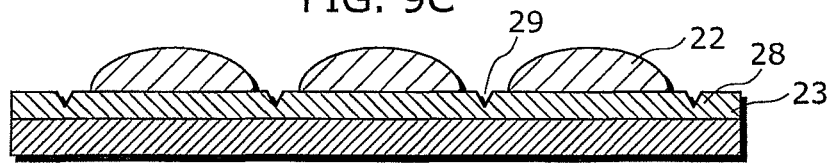
FIG. 9C illustrates a process in step 105 of the manufacturing method of the display panel apparatus according to the first embodiment of the present invention.

Next, as illustrated in FIG. 8 and FIG. 9A, the first walls 25 are formed on the glass substrate 24 (S103). The first walls 25 may be formed by dissolving and printing or painting material such as carbon black on the glass substrate 24. Here, the first partitions 25 are arranged at an interval for placing lenses 22 between the first partitions 25, and formed by metallic mold to have a tip of one end with a shape of sharpened triangle cross-section such that the tip corresponds to the shape of trenches 29 formed on the lens sheet 23 to be described later.

Next, in order to reinforce the base 28 of the lens sheet 23, a sheet-shaped base material 40 is bonded to a surface of the base 28 opposite to the side where the lenses 22 are placed (S104). The lenses 22 of the lens sheet 23 are made of acrylic resin such as the polymethylmethacrylate resin (methacrylic resin). The base 28 of the lens sheet 23 is made of polyethylene terephthalate (PET). Note that, the base 28 may be made of the same material as the lens 22. In addition, polycarbonate is used for the base material 40.

Next, a predetermined number of trenches 29 are formed on the base 28 of the lens sheet 23 on a side where the lenses 22 are provided, along the proximity of perimeter of the region where the lenses 22 are arranged (S105). The trenches 29 are formed to have a V-shaped cross section recessed in a direction opposite to the protruding direction of the lenses 22 from the surface of the base 28.

Figure 9D:
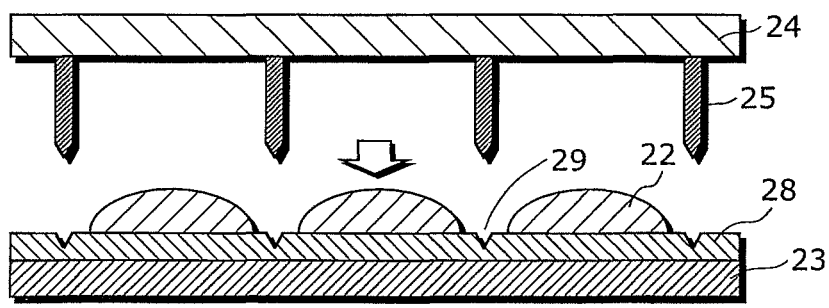
FIG. 9D illustrates a process in step 106 of the manufacturing method of the display panel apparatus according to the first embodiment of the present invention.

Next, the glass substrate 24 on which the first partitions 25 are formed in step S103 is flipped upside down by 180 degrees, and is placed above the lens sheet 23 formed in step S105, as illustrated in FIG. 8 and FIG. 9D (S106). Here, the first partitions 25 are placed facing the trenches 29.

Figure 9E:
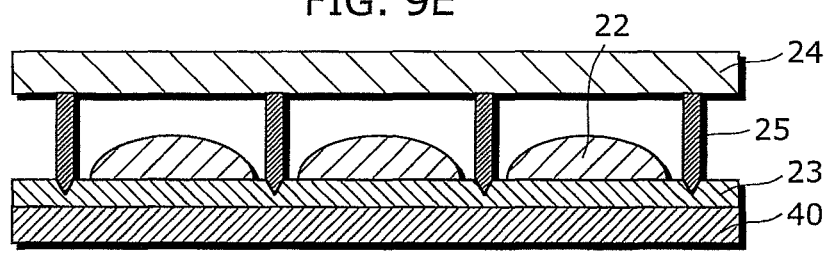
FIG. 9E illustrates a lens manufactured by a process in step 107 in the manufacturing method of the display panel apparatus according to the first embodiment of the present invention.

Next, as illustrated in FIG. 8 and FIG. 9E, the first partitions 25 are inserted into the trenches 29 on the lens sheet 23 (S107). Here, the tip of one end of the first partitions 25 to be inserted into the lens sheet 23 has a sharpened triangle cross-section. Thus, the tips of the first partitions 25 are inserted into the trenches 29 on the lens sheet 23 by self-alignment.

Figure 9F:
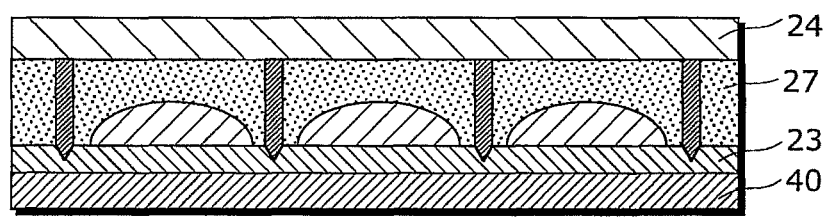
FIG. 9F illustrates a process in step 108 of the manufacturing method of the display panel apparatus according to the first embodiment of the present invention.

Next, as illustrated in FIG. 8 and FIG. 9F, adhesive is sealed between the lens sheet 23 and the glass substrate 24 to bond the lens sheet 23 and the glass substrate 24 (S108). Here, the adhesive is injected pouring from the side. The injected adhesive is filled between the lens sheet 23 and the glass substrate 24 by the capillary action. With this process, bonding layer 27 is formed between the lens sheet 23 and the glass substrate 24.

Figure 9G:
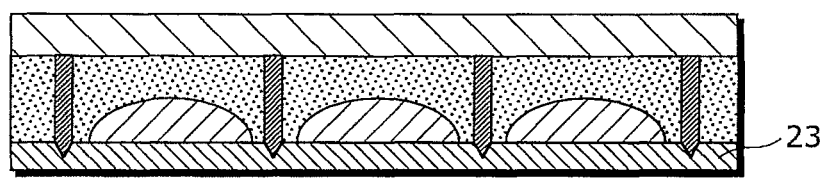
FIG. 9G illustrates a process in step 109 of the manufacturing method of the display panel apparatus according to the first embodiment of the present invention.

Next, as illustrated in FIG. 8 and FIG. 9G, the base material 40 is removed from the lens sheet 23 (S109). The base material 40 is removed by dissolving the base material 40 using sodium peroxide.

Figure 9H:
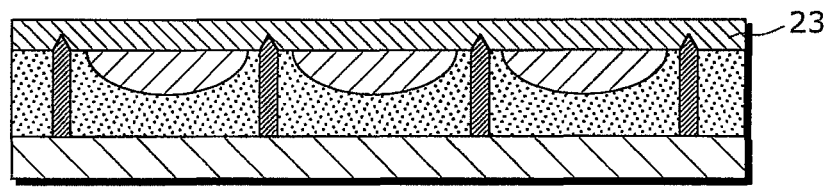
FIG. 9H illustrates a process in step 110 of the manufacturing method of the display panel apparatus according to the first embodiment of the present invention.

Next, as illustrated in FIG. 8 and FIG. 9H, the lens sheet 23 is flipped upside down by 180 degrees such that the bottom surface of the lens sheet 23 becomes the uppermost surface (S110).

Figure 9I:
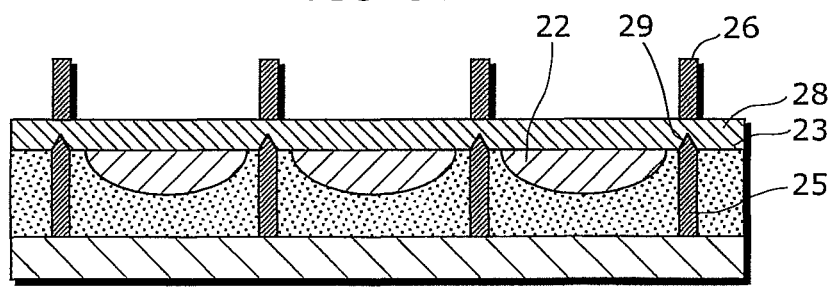
FIG. 9I illustrates a process in step 111 of the manufacturing method of the display panel apparatus according to the first embodiment of the present invention.

Next, as illustrated in FIG. 8 and FIG. 9I, the second partitions 26 are placed corresponding to the first partitions 25, on the side of the base 28 opposite to the side where the lenses 22 are provided (S111). Here, it is possible to project the first partitions 25 inserted into the trenches 29 through the lens sheet 23 for recognition. Thus, the positions for placing the second walls 26 can be easily visualized. Therefore, it is possible to align the first partitions 25 and the second partitions 26 highly precisely.

Figure 9J:
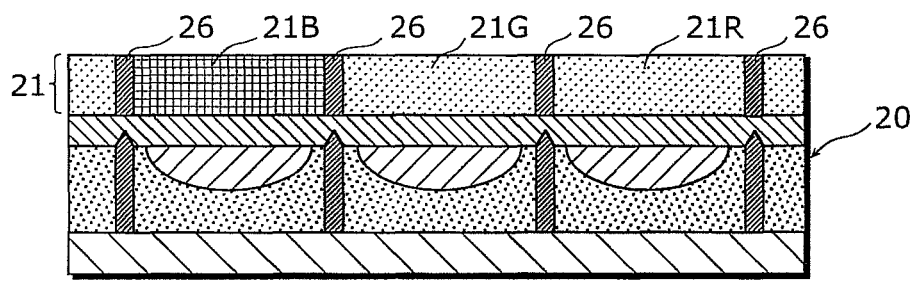
FIG. 9J illustrates lens unit manufactured in a process in step 112 of the manufacturing method of the display panel apparatus according to the first embodiment of the present invention.

Next, as illustrated in FIG. 8, the color filters for blue color 21B are formed by filling a resin which selectively transmits blue light between the second partitions 26 corresponding to the blue pixel units 12B when the organic EL unit 10 and the completed lens unit 20 are bonded (S112). Furthermore, the color filters for red color 21R and the color filters for green color 21G are formed by filling a transparent resin between the second partitions 26 corresponding to the red pixel units 12R and the green pixel unit 12G (S112). Thus, the color filter unit 21 made by filling the predetermined resins between the second partitions 26 as illustrated in FIG. 9J, completing the lens unit 20.

Figure 9K:
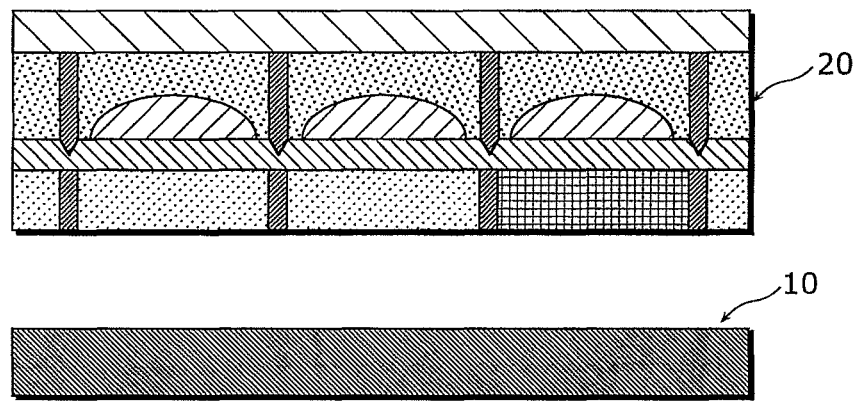
FIG. 9K illustrates a process in step 113 of the manufacturing method of the display panel apparatus according to the first embodiment of the present invention.

Next, as illustrated in FIG. 8 and FIG. 9K, the organic EL unit 10 prepared in steps S101 and S102 is placed, and the lens unit 20 completed in step S112 is flipped upside down and placed above the organic EL unit 10 (S113).

Figure 9L:
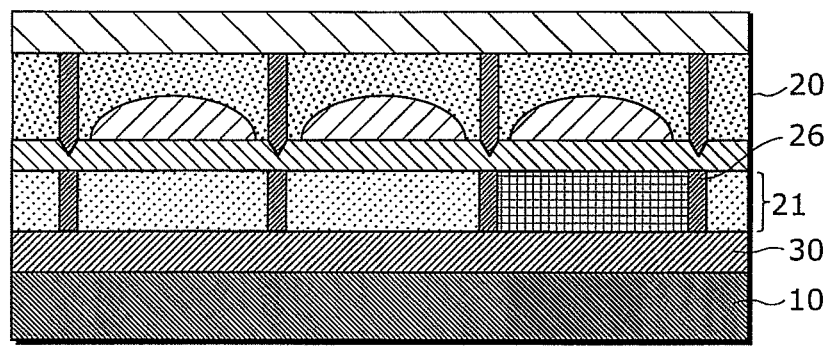
FIG. 9L is a cross-section of the display panel apparatus manufactured by the manufacturing method of the display panel apparatus according to the first embodiment of the present invention.

Next, as illustrated in FIG. 8, the adhesive as the sealing resin 30 is injected on the top surface of the sealing thin-film 19 of the organic EL unit 10 illustrated in FIG. 3, bonding the sealing thin-film 19 and the second partitions 26 and the color filter unit 21 (S114). With this, as illustrated in FIG. 9L, the organic EL unit 10 and the lens unit 20 are bonded by the sealing resin 30.

The display panel apparatus 1 according to this embodiment is completed by the processes described above.

As described above, in the manufacturing method according to this embodiment the first partitions 25 are placed on the lens sheet 23 after providing the base material 40 for reinforcing the base 28 on the base 28 of the lens sheet 23. Thus, the distortion in the lens sheet 23 in the manufacturing process when placing the first partitions 25, for example, can be prevented. Thus, it is possible to prevent the deterioration in the optical characteristics of the lens sheet 23 caused by the distortion in the lens sheet 23. Furthermore, in this embodiment, the base material 40 is removed after connecting the lens sheet 23 and the glass substrate 24 through the first partitions 25. With this, the lens sheet 23 is fixed with the glass substrate 24 through the first partitions 25. Thus, it is possible for the lens sheet 23 to maintain its shape after the base material 40. Thus, the display panel apparatus 1 manufactured by the manufacturing method according to this embodiment does not need any reinforcing material for reinforcing the lens sheet 23 such as the base material 40 between the glass substrate 24 and the organic EL unit 10. Thus, it is possible to reduce the layer between the glass substrate 24 and the organic EL unit 10. As a result, the display panel apparatus 1 capable of improving the light-extraction efficiency can be obtained.

Variation 1 of First Embodiment

Figure 10:
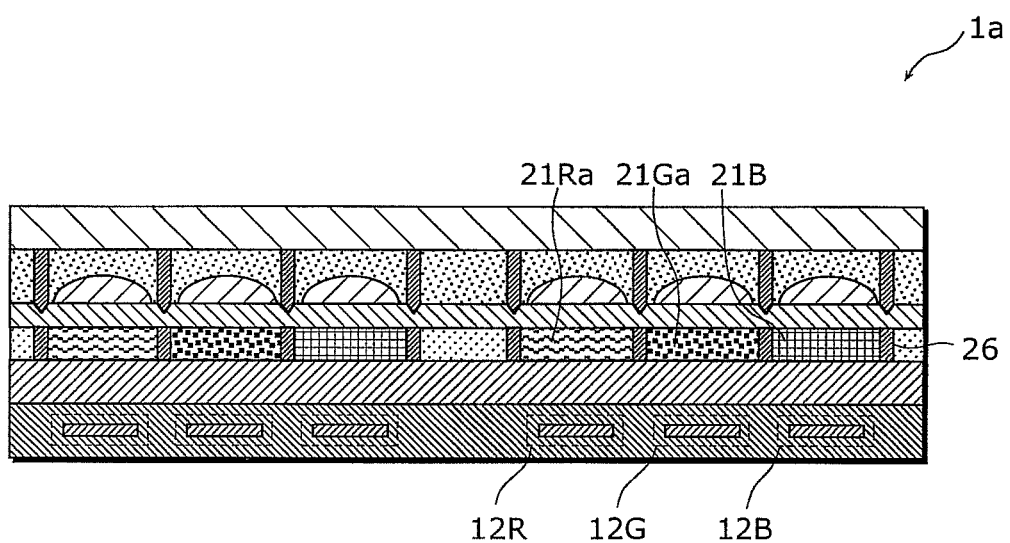
FIG. 10 is a partial enlarged cross-section view of a display panel apparatus according to a Variation 1 of the first embodiment of the present invention.

The display panel apparatus according to Variation 1 of the first embodiment of the present invention shall be described with reference to FIG. 10. FIG. 10 is a partial enlarged cross-section view of a display panel apparatus according to Variation 1 of the first embodiment of the present invention. Note that, the same reference numerals are assigned to the same components as the display panel apparatus according to the first embodiment in FIG. 2, and the description for these components is omitted.

The display panel apparatus 1a according to Variation 1 of the first embodiment is different from the display panel apparatus 1 according to the first embodiment in the structure of the color filters. Note that, the structure other than the color filter unit is identical.

In the display panel apparatus 1 according to the first embodiment, transparent resin is used for the color filter for red 21R and the color filter for green 21G corresponding to the red pixel unit 12R and the green pixel unit 12G, respectively. More specifically, the transparent resin is filled in the gap between the second partitions 26 corresponding to the red pixel unit 12R and the gap between the second partitions 26 corresponding to the green pixel unit 12G. In contrast, in the display panel apparatus 1a according to Variation 1, a resin which selectively transmits red light is filled in the gap between the second partitions 26 for forming a color filer for red 21Ra, instead of the transparent resin. In addition, a resin which selectively transmits green light is filled in the gap between the second partitions 26 corresponding to the green pixel unit 12G for forming a color filter for green 21Ga, instead of the transparent resin. Note that, the resin which selectively transmits blue light is filled in the gap between the second partitions 26 corresponding to the blue pixel unit 12B for forming the color filter for blue 21B, in the same manner as the first embodiment.

Note that, in the display panel apparatus 1a according to Variation 2, both the color filter for red 21R corresponding to the red pixel unit 12R and the color filter for green 21G corresponding to the green pixel unit 12G are made of resins which selectively transmit light. However, one of the color filters may be made of the transparent resin, and the other color filter may be made of the resin which selectively transmits light.

Variation 2 of First Embodiment

Figure 11:
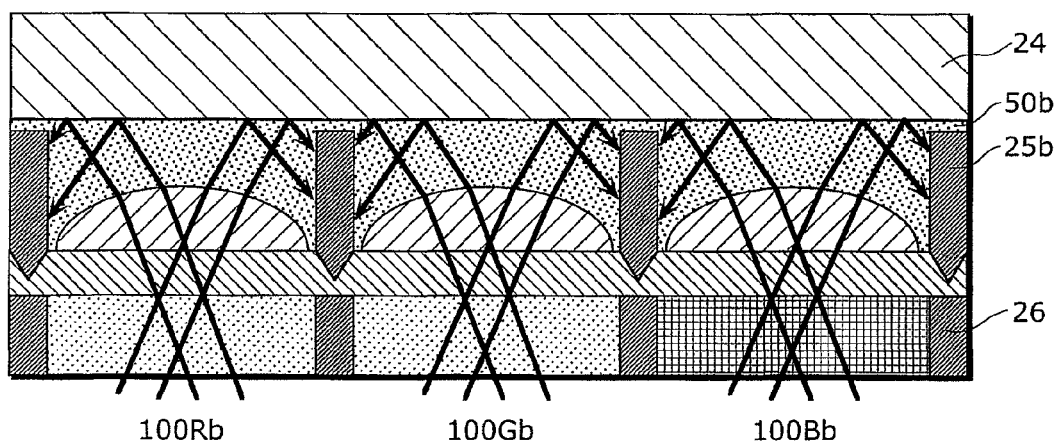
FIG. 11 is a partial enlarged cross-section view of a display panel apparatus according to Variation 2 of the first embodiment of the present invention.

The display panel apparatus according to Variation 2 of the first embodiment of the present invention shall be described with reference to FIG. 11. FIG. 11 is a partial enlarged cross-section view of a display panel apparatus according to Variation 2 of the first embodiment of the present invention. Note that, the same reference numerals are applied to the same component as the display panel apparatus according to the first embodiment in FIG. 5, and the description for these components is omitted.

The display panel apparatus 1b according to Variation 2 of the first embodiment of the present invention is different from the display panel apparatus 1 according to the first embodiment in the structure of the first partitions. Note that, the structure other than the first partitions is identical.

In the display panel apparatus 1 according to the first embodiment, the edges of the first partitions 25 on the glass substrate side contacts the glass substrate 24, as illustrated in FIG. 5. In contrast, in the display panel apparatus 1b according to Variation 2, the edges of the first partitions 25b on the glass substrate side may be extended to the proximity of the glass substrate 24 without contacting the glass substrate 24. More specifically, the first partitions 25b are formed to have gaps 50b between the glass substrate 24 and the first partitions 25b.

As such, in the display panel apparatus 1b according to Variation 2, the traveling light completely reflected on the glass substrate 24, among the light emitted from the red organic luminescent layer 11R, the green organic luminescent layer 11G, and the blue organic luminescent layer 11B can be blocked by the first partitions 25b, in the same manner a the display panel apparatus 1 according to the first embodiment illustrated in FIG. 5. Accordingly, in the display panel apparatus 1b according to the Variation 2, it is possible to prevent the light from entering the adjacent luminescent regions.

Furthermore, in the display panel apparatus 1b according to Variation 2, the first partitions 25b and the second partitions 26 are made of photo-absorptive material. Accordingly, the external light entering from the outside of the display panel apparatus 1b is absorbed by the first partitions 25 and the second partitions 26. Therefore, it is possible to block external light that entered inside the display panel apparatus 1b reaching the adjacent pixel unit 12 by the black matrix function. In addition, it is possible to prevent the external light traveling inside the display panel apparatus 1 from reflecting on the first electrodes 14 and exiting to outside again.

Variation 3 of First Embodiment

Figure 12:
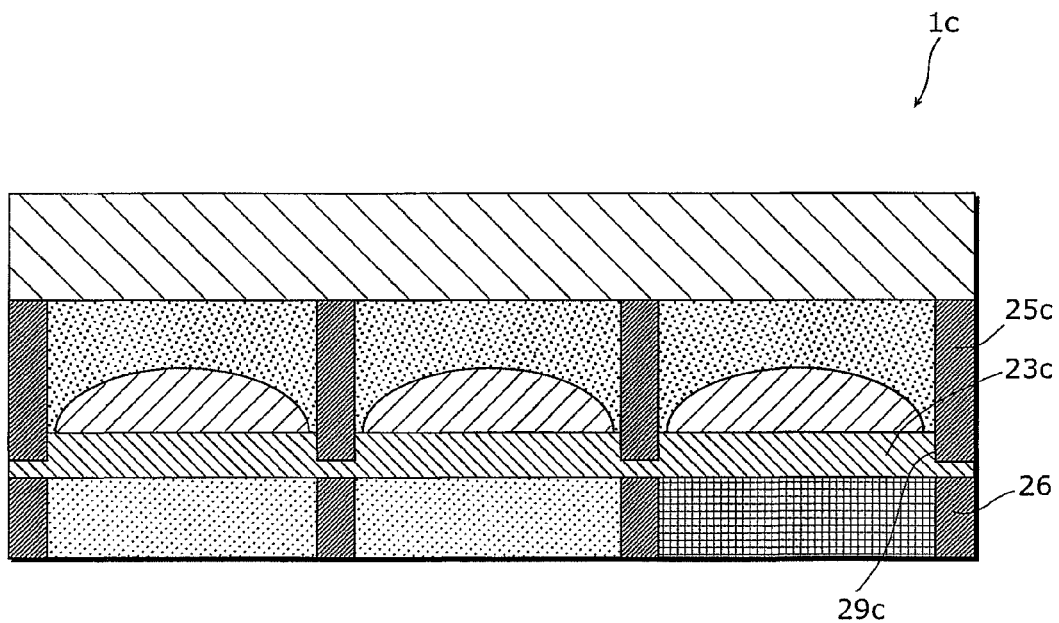
FIG. 12 is a partial enlarged cross-section view of a display panel apparatus according to Variation 3 of the first embodiment of the present invention.

The display panel apparatus according to Variation 3 of the first embodiment of the present invention shall be described with reference to FIG. 12. FIG. 12 is a partial enlarged cross-section view of a display panel apparatus according to Variation 3 of the first embodiment of the present invention. Note that, the same reference numerals are applied to the same component as the display panel apparatus according to the first embodiment in FIG. 5, and the description for these components is omitted.

The difference between the display panel apparatus 1c according to Variation 3 of the first embodiment and the display panel apparatus 1 according to the first embodiment is the shapes of the first partitions and the trenches on the lens sheet and the shape of the tip of the first partitions on the lens sheet side.

In the display panel apparatus 1 according to the first embodiment, the cross-section of the tips of the first partitions 25 has a triangular shape, and the cross-section of the trenches 29 on the lens sheet 23 is V-shaped, as illustrated in FIG. 5. In contrast, as illustrated in FIG. 12, in the display panel apparatus 1c according to Variation 3, the tips of the first partitions 25c on the lens sheet side is rectangular in cross-section and the trenches 29c of the lens sheet 23c is rectangular in cross-section as well.

The display panel apparatus 1c according to Variation 3 with the above-described structure also achieves the similar effect as the display panel apparatus 1 according to the first embodiment.

Note that, the shapes for the tips of the first partitions on the lens sheet side and the trenches on the lens sheet are not limited to the rectangular or triangular shape described above.

Second Embodiment

Figure 13:
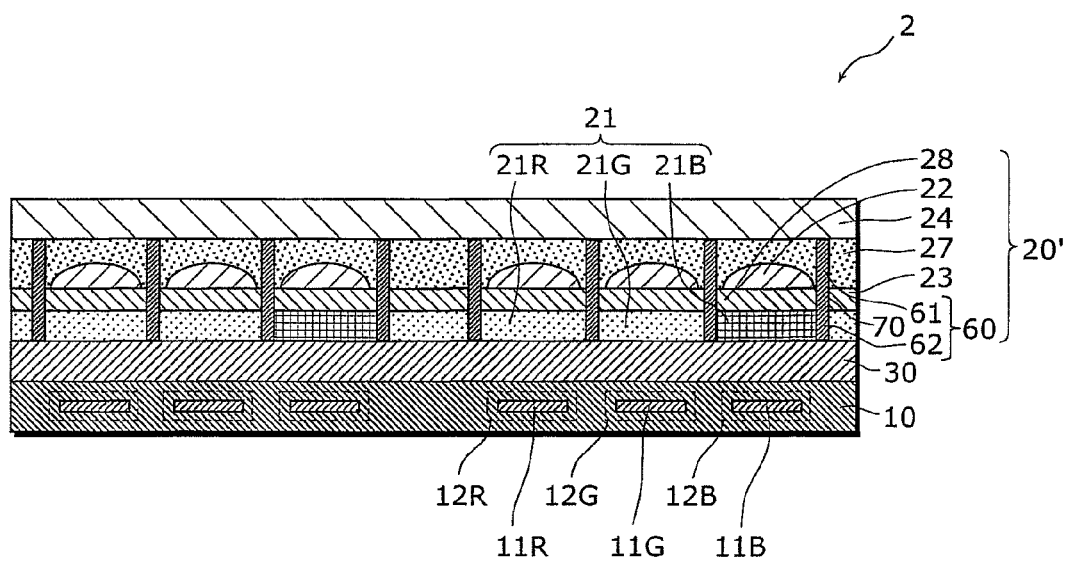
FIG. 13 is a cross-section of a display panel apparatus according to the second embodiment of the present invention.

Next, the following describes the display panel apparatus according to the second embodiment of the present invention. FIG. 13 is a cross-section of a display panel apparatus according to the second embodiment of the present invention. The display panel apparatus 2 illustrated in FIG. 13, according to the second embodiment of the present invention has the same basic stricture as the display panel apparatus 1 according to the first embodiment illustrated in FIG. 2. However, the display panel apparatus 2 according to the second embodiment of the present invention has partitions 60 for the lens unit 20' penetrating the lens sheet 23, which is different from the display panel apparatus 1 according to the first embodiment of the present invention with the partitions not penetrating the lens sheet 23. Note that, the same reference numerals are applied to components identical to the components in the display panel apparatus 1 according to the first embodiment of the present invention, and the description for them shall be omitted.

As illustrated in FIG. 13, the display panel apparatus 2 according to the second embodiment has the organic EL unit 10 and the lens unit 20' bonded by the sealing resin 30.

The lens unit 20' includes a color filter unit 21, a lens sheet 23 with lenses 22 and a base 28, a glass substrate 24, a bonding layer 27, and partitions 60. Furthermore, in this embodiment, the lens sheet 23 is provided with through-holes 70 for the partitions 60 to pass through. The positions of the through-holes 70 correspond to the positions of the trenches 29 on the lens sheet 23 of the display panel apparatus 1 according to the first embodiment of the present invention. More specifically, the through-holes 70 are formed along the perimeter of the region of the base 28 where the lens 22 are formed, and are arranged in stripe with respect to the column direction of the perimeter of the lenses 22 in the region of the base 28 where the lenses are formed in a planar view of the display panel apparatus 2.

The partitions 60 are inserted into the through-holes 70 in the lens sheet 23, and have first partitioning portions 61 and second partitioning portions 62. The first partitioning portions 61 are part of the partitions 60 extending to the side of the glass substrate 24 from the base 28 on the side where the lenses 22 are formed. The second partitioning portions 62 are part of the partitions 60 extending to the side of the color filter unit 21 from the base 28 on the side where the lenses 22 are not formed. The partitions 60 are made of photo-absorptive material such as carbon black.

The height of the first partitioning portions 61 is at least higher than the height of the lenses 22. As such, setting the height of the first partitioning portions 61 higher than the height of the lens 22 prevents the light completely reflected on the glass substrate 24 from entering the adjacent luminescent region, and also prevents the damage on the lens 22 caused by the glass substrate 24.

In this embodiment, the partitions 60 are made of a photo-absorptive material. Note that, the edges of the partitions 60 on the glass substrate side (the edges of the first partitioning portions on the glass substrate side) contact the glass substrate 24. Furthermore, the edges of the partitions 60 on the pixel unit side (the edges of the second partitioning portions 62 on the pixel unit side) contact the sealing resin 30.

The display panel apparatus 2 according to the second embodiment of the present invention with the structure described above can achieve the same effect as the display panel apparatus 1 according to the first embodiment of the present invention as illustrated in FIGS. 5 to 7.

More specifically, the display panel apparatus 2 illustrated in FIG. 13 according to the second embodiment of the present invention has the first partitioning portions 61 higher than the height of the lenses 22 between the lenses 22. Thus, the light completely reflected on the glass substrate 24 and traveling to the adjacent luminescent region among the light emitted from the red organic luminescent layer 11R is blocked by the first partitioning portions 61, in the same manner as FIG. 5. In the same manner, among the light emitted from the green organic luminescent layer 11G and the blue organic luminescent layer 11B, light 100G and 100B completely reflected on the glass substrate 24 and traveling toward the adjacent luminescent region is blocked by the first partitioning portions 61. With this, it is possible to prevent the light from entering the adjacent luminescent regions. In addition, when the light reflected on the glass substrate 24 reaches the second partitioning portions 62, the second partitioning portions 62 block the traveling reflected light, preventing the reflected light from traveling to the adjacent luminescent regions.

The partitions 60 are made of photo-absorptive material. Thus, in the same manner as the above-described FIG. 6, the partitions 60 can absorb the stray light which is light emitted from the organic luminescent layer directly traveling to the pixel unit, and the external light entering from outside of the display panel apparatus in the same manner as FIG. 7. This improves the contrast in the displayed image.

Figure 14:
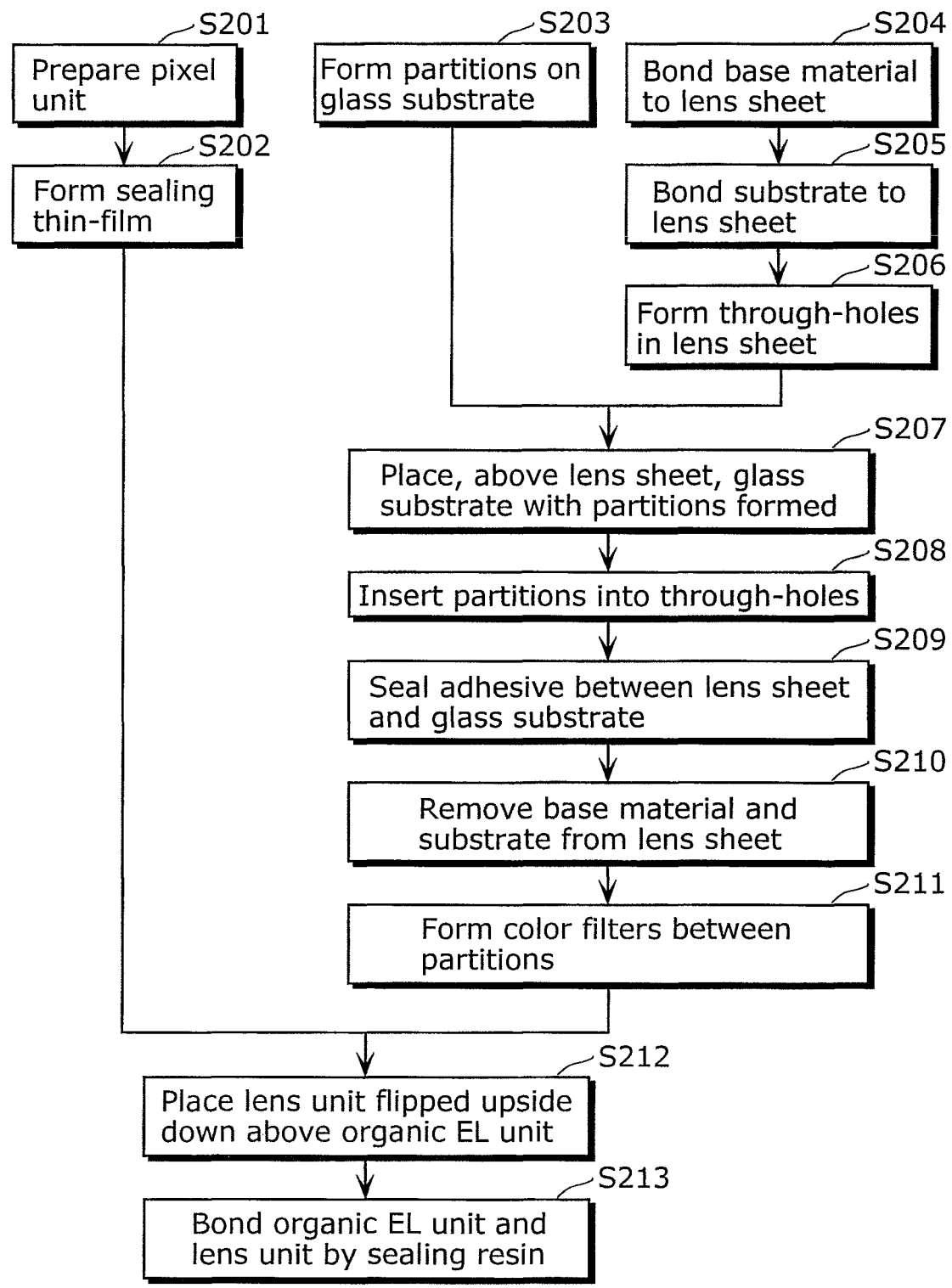
FIG. 14 is a flowchart illustrating a manufacturing method of a display panel apparatus according to the first embodiment of the present invention.

Next, the manufacturing method of the display panel apparatus 2 according to the second embodiment of the present invention shall be described with reference to FIG. 14 and FIGS. 15A to 15K. FIG. 14 is a flowchart of the manufacturing method of a display panel apparatus according to the second embodiment of the present invention. FIGS. 15A to 15K are cross-section of the components of the display panel apparatus in each process of the manufacturing method of the display panel apparatus according to the second embodiment of the present invention.

As illustrated in FIG. 14, on a substrate where a TFT layer and a planarizing film for planarizing the surface of the TFT layer are formed, pixel units 12 including a red organic luminescent layer 11R, a green organic luminescent layer 11G and a blue organic luminescent layer 11B interposed between the first electrodes 14 and the second electrode 18 (S201).

Next, the sealing thin-film 19 which serves as a sealing layer for sealing the pixel units 12 is formed above the second electrode 18 (S202). With this, the organic EL unit 10 is prepared.

Figure 15A:
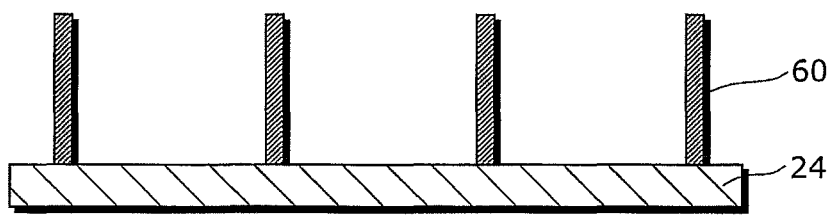
FIG. 15A illustrates a process in step 203 in the manufacturing method of the display panel apparatus according to the second embodiment of the present invention.

Next, as illustrated in FIG. 14 and FIG. 15A, the plate-formed partitions 60 are formed on the glass substrate 24 (S203). The partitions 60 can be formed by dissolving and printing or painting materials such as carbon black, for example. Here, partitions 60 are arranged at an interval for placing lenses 22 between the first partitions 60, and each formed by metallic mold to adjust the form of one end of the partitions 60 to be inserted into the lens sheet 23 to correspond to the shape of the through-holes 70 formed on the lens sheet 23 to be described later.

Figure 15B:
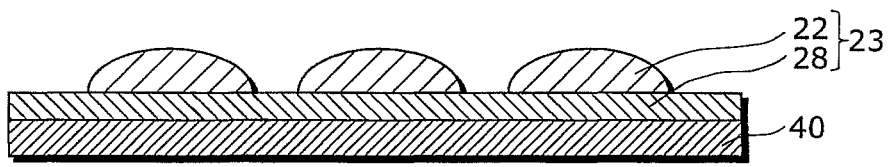
FIG. 15B illustrates a process in step 204 in the manufacturing method of the display panel apparatus according to the second embodiment of the present invention.

Next, as illustrated in FIG. 14 and FIG. 15B, in order to reinforce the base 28 of the lens sheet 23, a sheet-shaped base material 40 is bonded to a surface of the base 28 opposite to the side where the lenses 22 are formed (S204). The base 28 of the lens sheet 23 is made of polyethylene terephthalate (PET). The lenses 22 of the lens sheet 23 are made of acrylic resin such as the polymethylmethacrylate resin (methacrylic resin). In addition, polycarbonate is used for the base material 40.

Figure 15C:
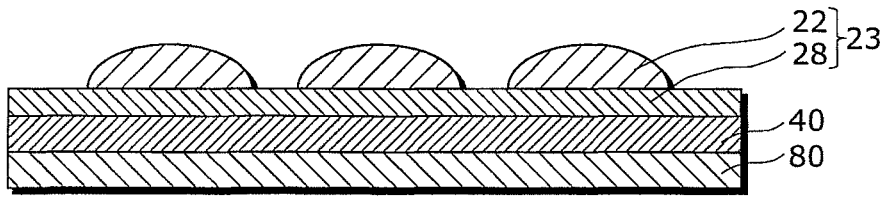
FIG. 15C illustrates a process in step 205 in the manufacturing method of the display panel apparatus according to the second embodiment of the present invention.

Next, as illustrated in FIG. 14 and FIG. 15C, a sheet-shaped substrate 80 for forming the through-holes 70 is bonded to the bottom surface of the base material 40 (S205). The substrate 80 is made of acrylic resin such as the polymethylmethacrylate resin (methacrylic resin).

Figure 15D:
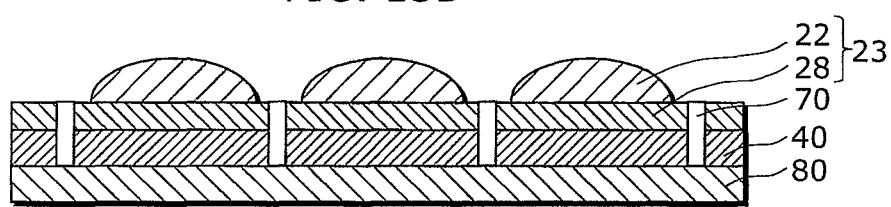
FIG. 15D illustrates a process in step 206 in the manufacturing method of the display panel apparatus according to the second embodiment of the present invention.

Next, as illustrated in FIG. 14 and FIG. 15D, the through-holes 70 for inserting the partitions 60 are formed at the base 28 of the lens sheet 23 (S206). The through-holes 70 may be formed by a $CO_2$ laser or a UV laser. Upon forming the through-holes 70 on the base 28, the through-holes are also formed on the base material 40, using the substrate 80 as a stopper.

Figure 15E:
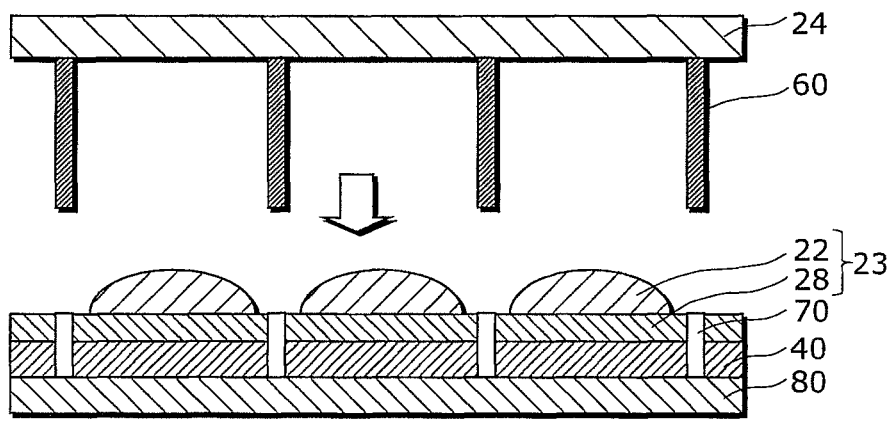
FIG. 15E illustrates a lens manufactured by a process in step 207 in the manufacturing method of the display panel apparatus according to the second embodiment of the present invention.

Next, as illustrated in FIG. 14 and FIG. 15E, the glass substrate 24 on which the partitions 60 formed in step S203 is flipped upside down by 180 degrees, and the flipped glass substrate 24 is placed above the lens sheet 23 formed in step S206 (S207).

Figure 15F:
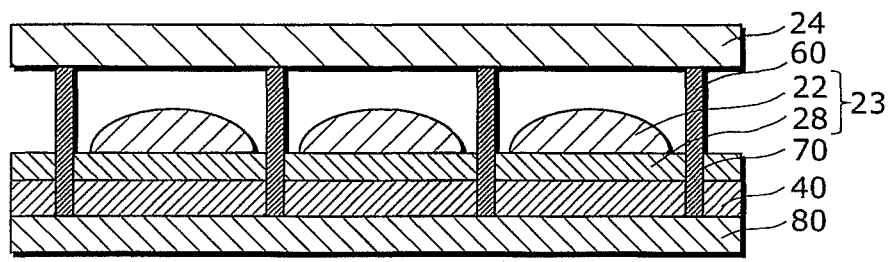
FIG. 15F illustrates a process in step 208 in the manufacturing method of the display panel apparatus according to the second embodiment of the present invention.

Next, as illustrated in FIG. 14 and FIG. 15F, the partitions 60 formed on the glass substrate 24 is inserted into the through-holes 70 of the base 28 of the lens sheet 23 (S208). Here, the partitions 60 are inserted until one ends abut the substrate 80.

Figure 15G:
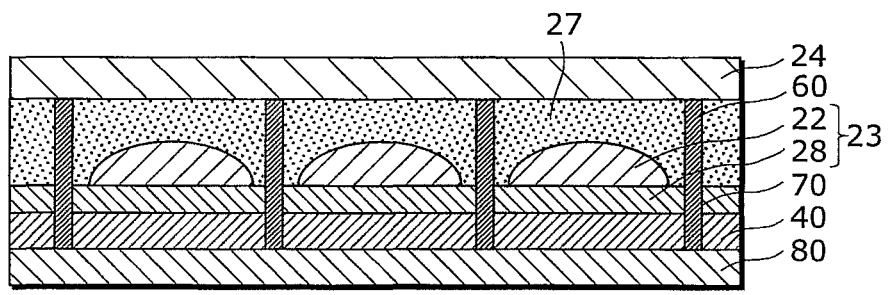
FIG. 15G illustrates a process in step 209 of the manufacturing method of the display panel apparatus according to the second embodiment of the present invention.

Next, as illustrated in FIG. 14, the lens sheet 23 and the glass substrate 24 are bonded by sealing adhesive between the lens sheet 23 and the glass substrate 24 (S209). Here, the adhesive is injected by pouring from the side. The injected adhesive is filled between the lens sheet 23 and the glass substrate 24 by the capillary action. With this, as illustrated in FIG. 15G, the bonding layer 27 is formed between the lens sheet 23 and the glass substrate 24.

Figure 15H:
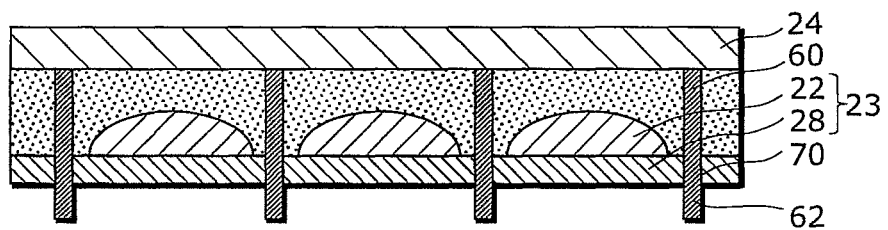
FIG. 15H illustrates a process in step 210 of the manufacturing method of the display panel apparatus according to the second embodiment of the present invention.

Next, as illustrated in FIG. 14 and FIG. 15H, the base material 40 and the substrate 80 are removed from the lens sheet 23 (S210). As a solvent used for removing the base material 40 from the lens sheet 23 is a solvent that dissolves the base material 40 and the substrate 80 without dissolving the lens sheet 23. For example, the base material 40 and the substrate 80 can be dissolved using a solvent such as sodium peroxide. This process exposes the second partitioning portion 62 of the partitions 60. In this embodiment, the height of the second partitioning portions 62 is determined based on the thickness of the base material 40. More specifically, the thickness of the base material 40 is the height of the second partitioning portions 62. Accordingly, the height of the second partitioning portions 62, that is, thickness of the color filter unit 21 can be determined by adjusting the thickness of the base material 40.

Figure 15I:
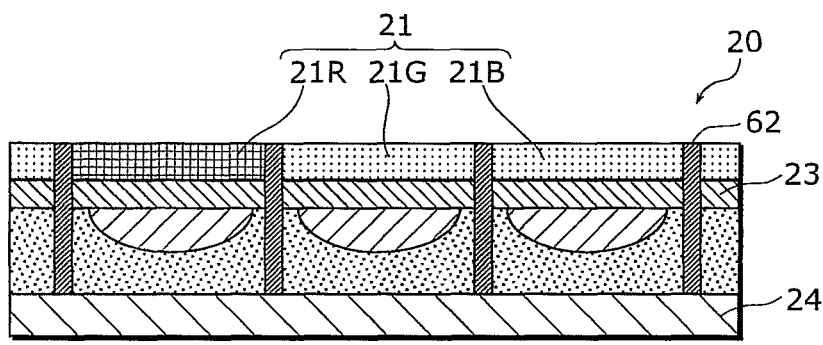
FIG. 15I illustrates a process in step 211 of the manufacturing method of the display panel apparatus according to the second embodiment of the present invention.

Next, as illustrated FIG. 15I, the lens sheet 23 is flipped upside down by 180 degrees to set the top surface of the glass substrate 24 to be the lowermost surface. Subsequently, the resin which selectively transmits blue light is filled in the gap to form the color filters for blue 21B between the second partitions 62 corresponding to the blue pixel units 12B when the organic EL unit 10 and the completed lens unit 20 are bonded. In addition, the transparent resin is filled between the gaps between the second partitioning portions 62 corresponding to the red pixel units 12R and the green pixel units 12G for forming the color filters for red 21R and the color filters for green 21G, respectively. With this, as illustrated in FIG. 15I, the color filter unit 21 in which the resins corresponding to predetermined colors can be formed between the second partitioning portions 62, completing the lens unit 20 (S211).

Figure 15J:
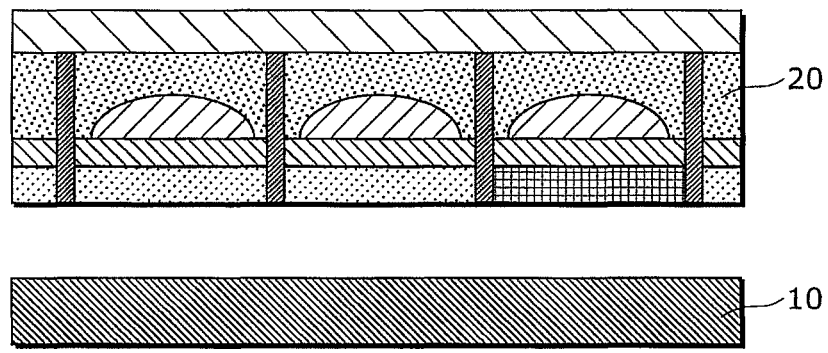
FIG. 15J illustrates a process in step 212 of the manufacturing method of the display panel apparatus according to the second embodiment of the present invention.

Next, as illustrated in FIG. 14 and FIG. 15J, the organic EL unit 10 prepared in step S202 is placed, and the lens unit 20 completed in step S211 is flipped over and placed above the organic EL unit 10 (S212).

Figure 15K:
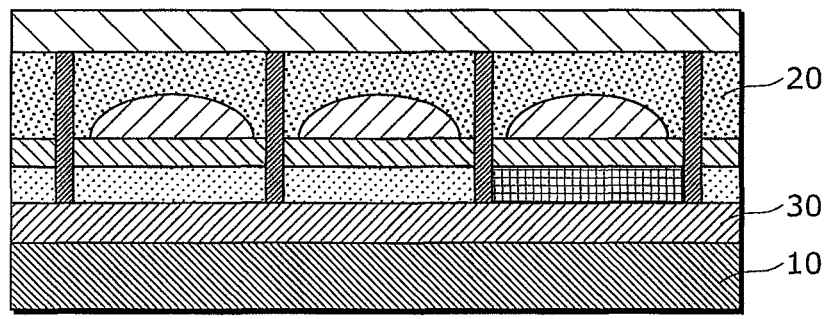
FIG. 15K is a cross-section of the display panel apparatus manufactured by the manufacturing method of the display panel apparatus according to the second embodiment of the present invention.

Next, as illustrated in FIG. 14, the adhesive as the sealing resin 30 is injected on the top surface of the sealing thin-film 19 of the organic EL unit 10 for bonding the sealing thin-film 19 and the partitions 60 and the color filter unit 21 (S213). With this, as illustrated in FIG. 15K, the organic EL unit 10 and the lens unit 20 are bonded by the sealing resin 30.

The display panel apparatus 2 according to this embodiment is completed by the processes described above.

Variation of Second Embodiment

Figure 16:
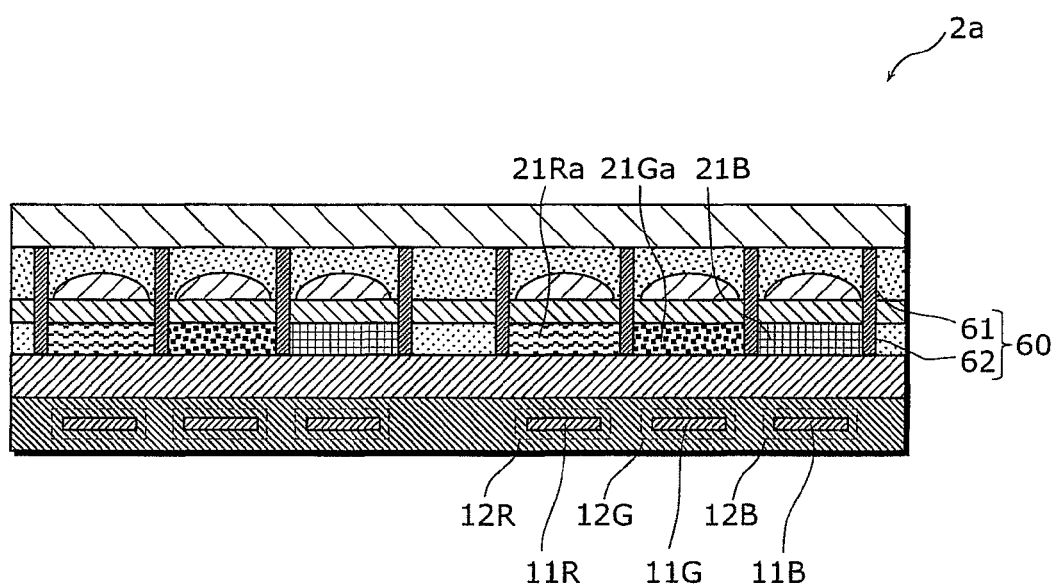
FIG. 16 is a partial enlarged cross-section view of a display panel apparatus according to Variation of the second embodiment of the present invention.

Next, the display panel apparatus 2a according to Variation of the second embodiment of the present invention shall be described with reference to FIG. 16. FIG. 16 is a partial enlarged cross-section view of a display panel apparatus according to Variation of the second embodiment of the present invention. Note that the same reference numerals are assigned to the components identical to the components of the display panel apparatus 2 according to the second embodiment, and the description of the components is omitted.

The display panel apparatus 2a according to Variation of the second embodiment of the present invention and the display panel apparatus 2 according to the second embodiment of the present invention are different in the structure of the color filter unit. Note that, the components other than the color filter unit are identical.

In the display panel apparatus 2 according to the second embodiment, the transparent resin is used for the color filter for red 21R and the color filter for green 21G corresponding to the red pixel unit 12R and the green pixel unit 12G, respectively. More specifically, the transparent resin is filled in the gaps between the second partitioning portions 62 corresponding to the red pixel units 12R and the second partitioning portions 62 corresponding to the green pixel units 12. In contrast, in the display panel apparatus 2a according to Variation 2, a resin which selectively transmits red light is filled in the gap between the second partitioning portions 26 for forming the color filer for red 21Ra, instead of the transparent resin. In addition, a resin which selectively transmits green light is filled in the gap between the second partitioning portions 62 corresponding to the green pixel unit 12G for forming a color filter for green 21Ga, instead of the transparent resin. Note that, the resin which selectively transmits blue light is filled in the gap between the second partitioning portions 62 corresponding to the blue pixel unit 12B for forming the color filter for blue 21B, in the same manner as the first embodiment.

Note that, in the display panel apparatus 2a according to this Variation, the color filters for red 21R corresponding to the red pixel units 12R and the color filters for green 21G corresponding to green pixel unit 12G are made of the resin that selectively transmit light. However, one of the color filters may be made of the transparent resin, while the other color filters may be made of the resin which selectively transmits light.

Figure 17:
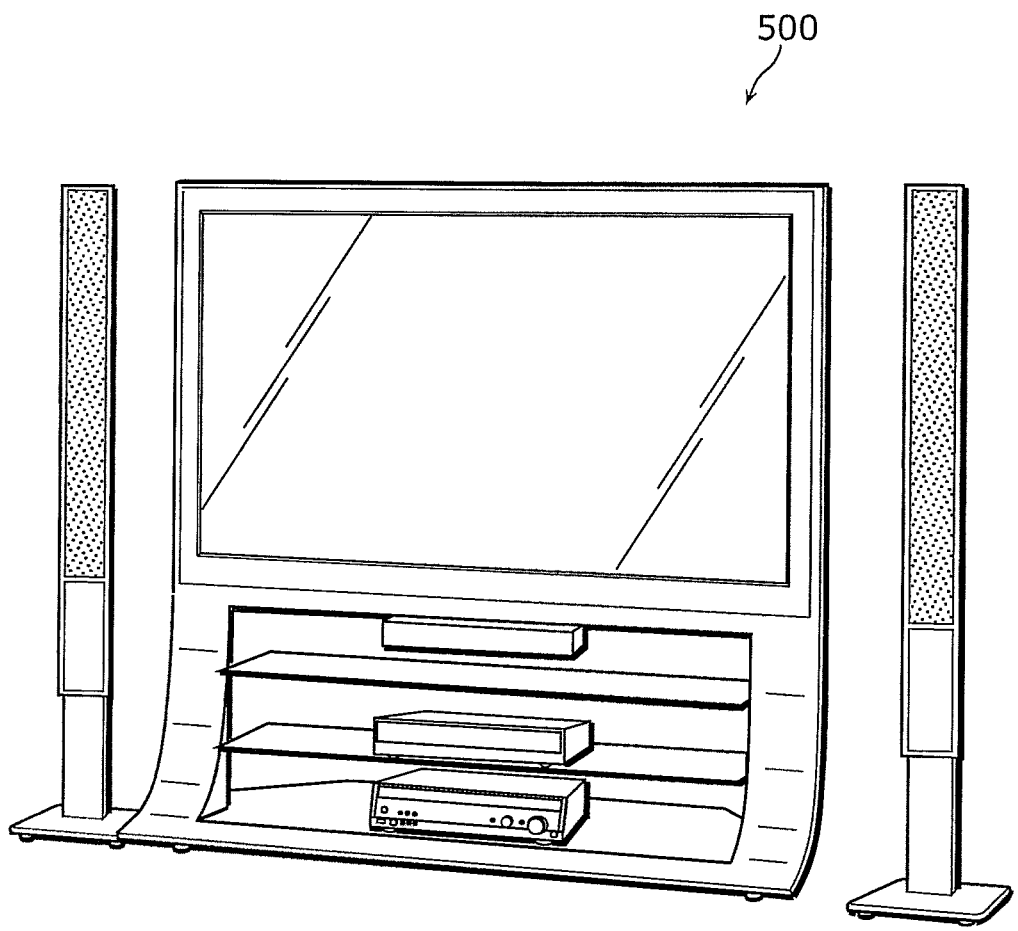
FIG. 17 is an external view of the display apparatus according to the embodiments of the present invention to which the display panel apparatus is embedded.
Figure 18:
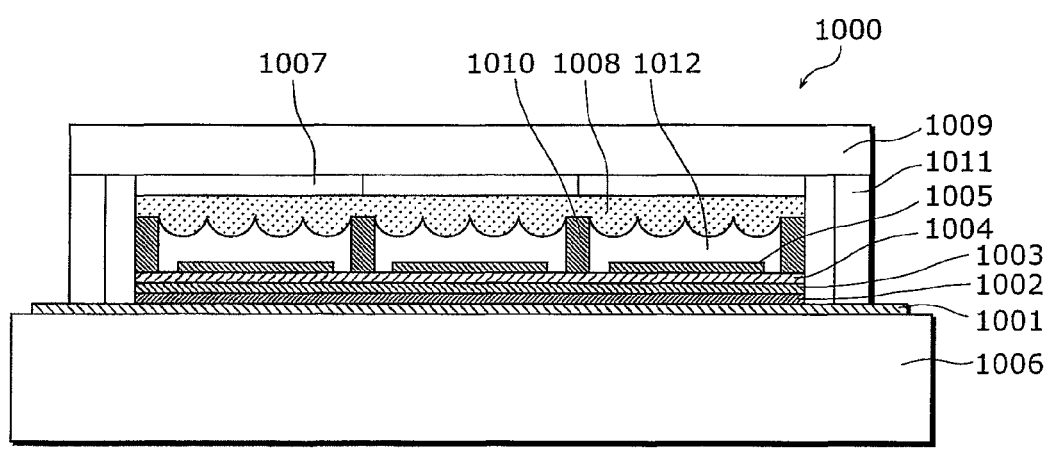
FIG. 18 is a cross-section of a conventional display panel apparatus disclosed in Patent Literature 1.

As such, the display panel apparatus according to the embodiments of the present invention can be used as flat panel display, for example, and is applicable to any display device in the television set 500 illustrated in FIG. 17, mobile phones, personal computers, and others.

Although only some exemplary embodiments of the display panel apparatus and the manufacturing method of the display panel apparatus according to the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The display panel apparatus according to the present invention can be used as any display apparatus in television sets, mobile phones, and personal computers.

What is claimed is:

1. A display panel apparatus, comprising:
   an organic electro-luminescence unit including an array of pixels, the pixels each including a first electrode, a second electrode, and an organic luminescent layer between the first electrode and the second electrode, the organic luminescent layer of each of the pixels configured to emit light, the organic luminescent layer of at least one blue pixel of the pixels configured to emit blue light;
   a glass substrate above the organic electro-luminescence unit;
   a lens sheet between the organic electro-luminescence unit and the glass substrate and including a lens corresponding to each of the pixels and a base from which the lens protrudes;
   a first partition between the glass substrate and the lens sheet on a first side of the base from which the lens protrudes for partitioning, between the glass substrate and the lens sheet, a gap between the lens of each of the pixels, the first partition having a first height greater than a second height of the lens of each of the pixels; and
   a second partition between the organic electro-luminescence unit and the lens sheet on a second side of the base opposite the first side from which the lens protrudes and corresponding to the first partition for partitioning, between the organic electro-luminescence unit and the lens sheet, the gap between the lens of each of the pixels, wherein
a space partitioned by the second partition and corresponding to the blue pixel that includes the organic luminescent layer that is configured to emit the blue light includes a resin that is configured to selectively transmit the blue light.

2. The display panel apparatus according to claim 1, wherein
the pixels include:
a first pixel corresponding to a first color; and
a second pixel adjacent the first pixel and corresponding to a second color different than the first color, and
the first partition and the second partition are configured to block reflected light traveling to the second pixel due to reflection from the glass substrate, the reflected light configured to be emit from the organic luminescent layer included in the first pixel and partitioned by the first partition and the second partition.

3. The display panel apparatus according to claim 2, wherein
the lens sheet includes a trench in the base, the trench being recessed from a surface of the base in a direction opposite a protruding direction of the lens,
the base is between the first partition and the second partition,
the first partition is in the trench,
the second partition corresponds to the first partition that is in the trench, and
the trench is included for aligning the first partition and the second partition.

4. The display panel apparatus according to claim 3, wherein
a portion of the first partition that is in the trench is configured to block the reflected light traveling to the second pixel due to the reflection from the glass substrate.

5. The display panel apparatus according to claim 3, wherein
a ratio of a distance, from an end of the portion of the first partition that is in the trench to the surface of the base, to a thickness of the base is greater than 0 and at most ⅔.

6. The display panel apparatus according to claim 2, wherein
sides of the first partition and the second partition are black, and
the first partition and the second partition are configured to block the reflected light traveling from the first pixel to the second pixel by absorbing the reflected light.

7. The display panel apparatus according to claim 6, wherein
the first partition and the second partition are configured to block second light traveling directly from the first pixel to the second pixel by absorbing the second light, the second light configured to be emitted from the organic luminescent layer included in the first pixel.

8. The display panel apparatus according to claim 6, wherein
the first partition and the second partition are configured to absorb third light entering the first pixel from outside of the display panel apparatus via the glass substrate.

9. The display panel apparatus according to claim 1, wherein
a first ratio of a first width of a first bottom surface of the first partition to a thickness of the base is at least 3 and at most 50, and
a second ratio of a second width of a second bottom surface of the second partition to the thickness of the base is at least 3 and at most 50.

10. The display panel apparatus according to claim 1, wherein
the first partition penetrates the lens sheet and is connected to the second partition.

11. The display panel apparatus according to claim 1, wherein
the organic luminescent layer of a red pixel of the pixels is configured to emit the red light,
the organic luminescent layer of a green pixel of the pixels is configured to emit the green light, and
second spaces partitioned by the second partition and corresponding to the red pixel and the blue pixel include a second resin that has a transmission factor of light of at least 95% and less than 100%.

12. The display panel apparatus according to claim 1, wherein
the organic luminescent layer of a green pixel of the pixels is configured to emit green light, and
a second space partitioned by the second partition and corresponding to the green pixel includes a second resin that is configured to selectively transmit the green light.

13. The display panel apparatus according to claim 12, wherein
the organic luminescent layer of a red pixel of the pixels is configured to emit red light, and
a third space partitioned by the second partition and corresponding to the red pixel includes a third resin that is configured to selectively transmit the red light.

14. The display panel apparatus according to claim 1, wherein
the first partition extends approximately to the glass substrate.

15. The display panel apparatus according to claim 1, wherein
the first partition contacts the glass substrate.

16. The display panel apparatus according to claim 1, wherein
multiple pixels of the pixels are formed along a predetermined direction and are each configured to emit the light in a same color, and
the first partition partitions the gap between the lens of each of the pixels that is formed along the predetermined direction and is configured to emit the light in a color different than the same color.

17. The display panel apparatus according to claim 16, wherein
the lens is elongated in a top view and has an elliptic arc shape with a predetermined curvature factor in a cross-sectional view that is orthogonal to a longitudinal direction of the lens.

18. The display panel apparatus according to claim 16, wherein
a hole injection layer that injects holes into the organic luminescent layer is between the organic luminescent layer and the first electrode.

19. A display apparatus, comprising:
the display panel apparatus according to claim 16.

20. The display panel apparatus according to claim 1, further comprising:
a sealing layer above the second electrode for sealing the pixels.

21. The display panel apparatus according to claim 1, further comprising:
a bonding layer over the lens that is configured to planarize irregularities and bonds the lens sheet and the glass substrate.

22. The display panel apparatus according to claim 21, wherein
the glass substrate comprises an outer surface of the display panel apparatus.

* * * * *